(12) United States Patent
Cho et al.

(10) Patent No.: US 12,368,465 B2
(45) Date of Patent: Jul. 22, 2025

(54) ELECTRONIC DEVICE INCLUDING WATERPROOF STRUCTURE

(71) Applicant: Samsung Electronics Co., Ltd., Gyeonggi-do (KR)

(72) Inventors: Sunggun Cho, Gyeonggi-do (KR); Jongkeun Kim, Gyeonggi-do (KR); Wonhee Choi, Gyeonggi-do (KR); Jaehee Kim, Gyeonggi-do (KR); Hwamok Park, Gyeonggi-do (KR); Minyee An, Gyeonggi-do (KR); Dongik Lee, Gyeonggi-do (KR)

(73) Assignee: Samsung Electronics Co., Ltd, Suwon-si (KR)

( * ) Notice: Subject to any disclaimer, the term of this patent is extended or adjusted under 35 U.S.C. 154(b) by 0 days.

(21) Appl. No.: 18/598,579

(22) Filed: Mar. 7, 2024

(65) Prior Publication Data

US 2024/0267073 A1    Aug. 8, 2024

Related U.S. Application Data

(63) Continuation of application No. 17/591,712, filed on Feb. 3, 2022, now Pat. No. 11,956,002, which is a
(Continued)

(30) Foreign Application Priority Data

Feb. 10, 2021  (KR) .................. 10-2021-0019059

(51) Int. Cl.
  *G06F 1/16*     (2006.01)
  *H04B 1/3888*   (2015.01)
  (Continued)

(52) U.S. Cl.
  CPC ......... *H04B 1/3888* (2013.01); *G06F 1/1626* (2013.01); *G06F 1/1656* (2013.01);
  (Continued)

(58) Field of Classification Search
  CPC combination set(s) only.
  See application file for complete search history.

(56) References Cited

U.S. PATENT DOCUMENTS 8,003,898 B2   8/2011   Hayashi et al.
8,625,290 B2   1/2014   Wee et al.
(Continued)

FOREIGN PATENT DOCUMENTS

EP    3686711 A1    7/2020
JP    2009-4830 A   1/2009
(Continued)

OTHER PUBLICATIONS

International Search Report dated Apr. 22, 2022.
(Continued)

*Primary Examiner* — Lisa Lea-Edmonds
(74) *Attorney, Agent, or Firm* — Cha & Reiter, LLC

(57) ABSTRACT

Disclosed is an electronic device includes a flexible circuit board passing via a first through-hole included in a first housing and a second through-hole included in a second housing, a first support bracket disposed to support the flexible circuit board while covering the first through-hole, a second support bracket disposed to support the flexible circuit board while covering the second through-hole, a first waterproof member disposed to face a partial area of the first through-hole from the first support bracket and inserted into the partial area of the first through-hole, a second waterproof member inserted into the remaining areas of the first through-hole, a third waterproof member disposed to face a partial area of the second through-hole from the second support bracket and inserted into the partial area of the second through-hole, a fourth waterproof member inserted into the remaining areas of the second through-hole.

20 Claims, 33 Drawing Sheets

Related U.S. Application Data continuation of application No. PCT/KR2022/000347, filed on Jan. 10, 2022.

(51) Int. Cl.
  *H04M 1/02* (2006.01)
  *H05K 1/18* (2006.01)
  *H04B 1/38* (2015.01)

(52) U.S. Cl.
  CPC ........ *G06F 1/1681* (2013.01); *H04M 1/0277* (2013.01); *H05K 1/189* (2013.01); *H04B 2001/3894* (2013.01)

(56) References Cited

U.S. PATENT DOCUMENTS

| | | | |
|---|---|---|---|
| 9,912,138 | B2 | 3/2018 | Wee et al. |
| 10,469,635 | B1 | 11/2019 | Carlson et al. |
| 10,528,086 | B2 | 1/2020 | Chung |
| 10,587,735 | B1 | 3/2020 | Carlson et al. |
| 10,736,211 | B2 | 8/2020 | Park et al. |
| 11,159,660 | B2 | 10/2021 | Choi et al. |
| 11,314,284 | B2 | 4/2022 | Kim et al. |
| 11,528,349 | B2 | 12/2022 | Kim et al. |
| 12,038,787 | B2 * | 7/2024 | Kim ................ G06F 1/165 |
| 12,133,348 | B2 * | 10/2024 | Cho ................ H04M 1/0202 |
| 2009/0250261 | A1 | 10/2009 | Hayashi et al. |
| 2011/0090652 | A1 | 4/2011 | Wee et al. |
| 2014/0083761 | A1 | 3/2014 | Wee et al. |
| 2017/0086317 | A1 | 3/2017 | Pelletier et al. |
| 2019/0041917 | A1 | 2/2019 | Chung |
| 2020/0060020 | A1 | 2/2020 | Park et al. |
| 2020/0162596 | A1 | 5/2020 | Kim et al. |
| 2020/0236203 | A1 | 7/2020 | Carlson et al. |
| 2020/0413559 | A1 | 12/2020 | Lee et al. |
| 2021/0051220 | A1 | 2/2021 | Carlson et al. |
| 2022/0137667 | A1 * | 5/2022 | Kim ................ G06F 1/1686 361/679.21 |
| 2022/0244761 | A1 | 8/2022 | Kim et al. |
| 2022/0255576 | A1 * | 8/2022 | Cho ................ G06F 1/1656 |
| 2022/0386491 | A1 | 12/2022 | Cho |
| 2023/0007114 | A1 | 1/2023 | Cho et al. |
| 2023/0043759 | A1 | 2/2023 | Kang et al. |
| 2023/0048823 | A1 | 2/2023 | Cho et al. |
| 2023/0057510 | A1 | 2/2023 | Park et al. |
| 2023/0071540 | A1 | 3/2023 | Kim et al. |
| 2023/0262914 | A1 * | 8/2023 | Kang ................ G06F 1/1681 361/807 |
| 2023/0333601 | A1 | 10/2023 | Oh |
| 2023/0371192 | A1 | 11/2023 | Cho et al. |
| 2024/0267073 | A1 * | 8/2024 | Cho ................ H04M 1/0216 |
| 2024/0393841 | A1 * | 11/2024 | Kim ................ G06F 1/1681 |
| 2025/0056748 | A1 * | 2/2025 | Cho ................ H04M 1/0216 |

FOREIGN PATENT DOCUMENTS

| | | |
|---|---|---|
| JP | 2011-250076 A | 12/2011 |
| JP | 2019-211778 A | 12/2019 |
| KR | 10-2011-0041390 A | 4/2011 |
| KR | 10-2020-0021172 A | 2/2020 |
| KR | 10-2020-0057236 A | 5/2020 |
| KR | 10-2020-0091809 A | 7/2020 |
| KR | 10-2022-0060773 A | 5/2022 |
| RU | 2016137482 A | 3/2018 |

OTHER PUBLICATIONS

Korean Office Action dated Oct. 20, 2022.
Japanese Office Action dated Apr. 18, 2023.
Extended European Search Report dated Apr. 8, 2024.
Russian Search Report dated Apr. 3, 2025.
Russian Office Action dated Apr. 3, 2025.

* cited by examiner

ELECTRONIC DEVICE INCLUDING WATERPROOF STRUCTURE

CROSS-REFERENCE TO RELATED APPLICATION(S)

This application is a continuation of U.S. patent application Ser. No. 17/591,712 filed on Feb. 3, 2022, which is a continuation of International Application No. PCT/KR2022/000347 designating the United States, filed on Jan. 10, 2022, in the Korean Intellectual Property Receiving Office and claiming priority to Korean Patent Application No. 10-2021-0019059, filed on Feb. 10, 2021, in the Korean Intellectual Property Office, the disclosure of which is incorporated by reference herein its entirety.

BACKGROUND

Technical Field

One or more embodiments disclosed herein generally relate to an electronic device including a waterproof structure.

Description of Related Art

An electronic device may display images through a display disposed in its housing. A plurality of pixels for displaying the images may be disposed in the display. The plurality of pixels may receive data voltages and light emission signals for displaying the images from a display driver IC (DDI).

The electronic device may require a dustproof structure and a waterproof structure so that foreign substances may be prevented from entering the electronic device and interfering with its operations. For example, an electronic device, such as a mobile communication terminal, an electronic notebook, or a tablet PC, all of which are portable, may be exposed to various operation environments. But despite the changes in operation environments, the electronic device equipped with a dustproof structure and a waterproof structure in various forms may prevent contamination due to introduction of foreign substances and maintain stable operation performance even when the operation environments are not ideal.

SUMMARY

Electronic devices may block introduction of moisture and foreign substance by using a waterproof member disposed in the electronic devices. However, these electronic devices may not be suitable for mass production due to difficulties in the manufacture of at least one constituent element and the waterproof member included in the electronic device.

Certain embodiments of the disclosure provide an electronic device including a waterproof member that may provide a stable waterproof performance and convenience of manufacturing.

According to an aspect of the disclosure, an electronic device includes a first housing including a first through-hole, a second housing including a second through-hole, at least one flexible circuit board passing via the first through-hole and the second through-hole, a first support bracket disposed between the flexible circuit board and a display to support the flexible circuit board while covering the first through-hole, a second support bracket disposed between the flexible circuit board and the display to support the flexible circuit board while covering the second through-hole, a first waterproof member disposed to face a partial area of the first through-hole from the first support bracket and inserted into the partial area of the first through-hole, a second waterproof member facing the first waterproof member while the flexible circuit board is interposed therebetween, and inserted into the remaining areas of the first through-hole, a third waterproof member disposed to face a partial area of the second through-hole from the second support bracket and inserted into the partial area of the second through-hole, a fourth waterproof member facing the third waterproof member while the flexible circuit is being interposed therebetween, and inserted into the remaining areas of the second through-hole, a first sealing member disposed on the first waterproof member and the second waterproof member, and a second sealing member disposed on the third waterproof member and the fourth waterproof member.

Additional aspects will be set forth in part in the description which follows and, in part, will be apparent from the description, or may be learned by practice of the presented embodiments.

BRIEF DESCRIPTION OF THE DRAWINGS

The above and other aspects, features, and advantages of certain embodiments of the present disclosure will be more apparent from the following description taken in conjunction with the accompanying drawings, in which.

DETAILED DESCRIPTION

According to embodiments disclosed in the disclosure, the electronic device may have stable dustproof and waterproof performance by using the waterproof structure including the first waterproof member coupled to the support bracket, the second waterproof member, and the sealing member.

Furthermore, according to embodiments disclosed in the disclosure, convenience of assembly may be improved by separating the first waterproof member integrally formed with the support bracket and the second waterproof member and inserting them into a through-hole in opposite directions.

In addition, the disclosure may provide various effects that are directly or indirectly recognized.

Hereinafter, various embodiments of the disclosure will be described with reference to the accompanying drawings. Accordingly, those of ordinary skill in the art will recognize that modification, equivalent, and/or alternative on the various embodiments described herein can be variously made without departing from the scope and spirit of the disclosure.

Figure 1:
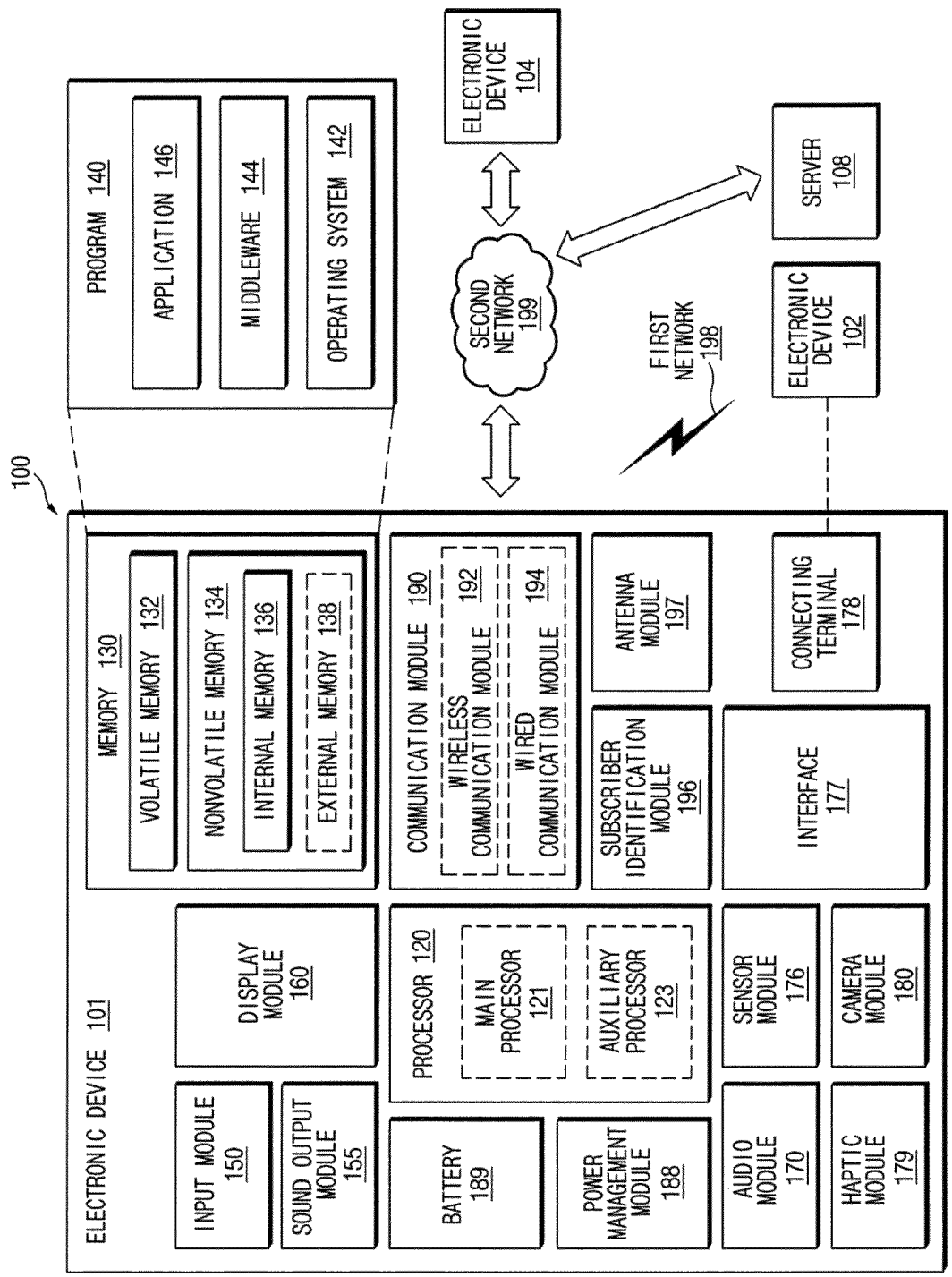
FIG. 1 is a block diagram illustrating an electronic device in a network environment according to an embodiment.

FIG. 1 is a block diagram illustrating an electronic device 101 in a network environment 100 according to various embodiments. Referring to FIG. 1, the electronic device 101 in the network environment 100 may communicate with an electronic device 102 via a first network 198 (e.g., a short-range wireless communication network), or an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input device 150, a sound output device 155, a display device 160, an audio module 170, a sensor module 176, an interface 177, a haptic module 179, a camera module 180, a power management module 188, a battery 189, a communication module 190, a subscriber identification module (SIM) 196, or an antenna module 197. In some embodiments, at least one (e.g., the display device 160 or the camera module 180) of the components may be omitted from the electronic device 101, or one or more other components may be added in the electronic device 101. In some embodiments, some of the components may be implemented as single integrated circuitry. For example, the sensor module 176 (e.g., a fingerprint sensor, an iris sensor, or an illuminance sensor) may be implemented as embedded in the display device 160 (e.g., a display).

The processor 120 may execute, for example, software (e.g., a program 140) to control at least one other component (e.g., a hardware or software component) of the electronic device 101 coupled with the processor 120, and may perform various data processing or computation. According to one embodiment, as at least part of the data processing or computation, the processor 120 may load a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), and an auxiliary processor 123 (e.g., a graphics processing unit (GPU), an image signal processor (ISP), a sensor hub processor, or a communication processor (CP)) that is operable independently from, or in conjunction with, the main processor 121. Additionally or alternatively, the auxiliary processor 123 may be adapted to consume less power than the main processor 121, or to be specific to a specified function. The auxiliary processor 123 may be implemented as separate from, or as part of the main processor 121.

The auxiliary processor 123 may control at least some of functions or states related to at least one component (e.g., the display device 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). According to an embodiment, the auxiliary processor 123 (e.g., an image signal processor or a communication processor) may be implemented as part of another component (e.g., the camera module 180 or the communication module 190) functionally related to the auxiliary processor 123.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134.

The program 140 may be stored in the memory 130 as software, and may include, for example, an operating system (OS) 142, middleware 144, or an application 146.

The input device 150 may receive a command or data to be used by other component (e.g., the processor 120) of the electronic device 101, from the outside (e.g., a user) of the electronic device 101. The input device 150 may include, for example, a microphone, a mouse, a keyboard, or a digital pen (e.g., a stylus pen).

The sound output device 155 may output sound signals to the outside of the electronic device 101. The sound output device 155 may include, for example, a speaker or a receiver. The speaker may be used for general purposes, such as playing multimedia or playing record, and the receiver may be used for an incoming calls. According to an embodiment, the receiver may be implemented as separate from, or as part of the speaker.

The display device 160 may visually provide information to the outside (e.g., a user) of the electronic device 101. The display device 160 may include, for example, a display, a hologram device, or a projector and control circuitry to control a corresponding one of the display, hologram device, and projector. According to an embodiment, the display device 160 may include touch circuitry adapted to detect a touch, or sensor circuitry (e.g., a pressure sensor) adapted to measure the intensity of force incurred by the touch.

The audio module 170 may convert a sound into an electrical signal and vice versa. According to an embodiment, the audio module 170 may obtain the sound via the input device 150, or output the sound via the sound output device 155 or a headphone of an external electronic device (e.g., an electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. According to an embodiment, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment, the connecting terminal 178 may include, for example, a HDMI connector, a USB connector, a SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, image signal processors, or flashes.

The power management module 188 may manage power supplied to the electronic device 101. According to one embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™, wireless-fidelity (Wi-Fi) direct, or infrared data association (IrDA)) or the second network 199 (e.g., a long-range communication network, such as a cellular network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the subscriber identification module 196.

The antenna module 197 may transmit or receive a signal or power to or from the outside (e.g., the external electronic device) of the electronic device 101. According to an embodiment, the antenna module 197 may include an antenna including a radiating element composed of a conductive material or a conductive pattern formed in or on a substrate (e.g., PCB). According to an embodiment, the antenna module 197 may include a plurality of antennas. In such a case, at least one antenna appropriate for a communication scheme used in the communication network, such as the first network 198 or the second network 199, may be selected, for example, by the communication module 190 (e.g., the wireless communication module 192) from the plurality of antennas. The signal or the power may then be transmitted or received between the communication module 190 and the external electronic device via the selected at least one antenna. According to an embodiment, another component (e.g., a radio frequency integrated circuit (RFIC)) other than the radiating element may be additionally formed as part of the antenna module 197.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. Each of the electronic devices 102 and 104 may be a device of a same type as, or a different type, from the electronic device 101. According to an embodiment, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, or client-server computing technology may be used, for example. The electronic device 101 may provide ultra low-latency services using, e.g., distributed computing or mobile edge computing. In another embodiment, the external electronic device #04 may include an internet-of-things (IoT) device. The server 108 may be an intelligent server using machine learning and/or a neural network. According to an embodiment, the external electronic device #04 or the server 108 may be included in the second network 199. The electronic device #01 may be applied to intelligent services (e.g., smart home, smart city, smart car, or healthcare) based on 5G communication technology or IoT-related technology.

Figure 2A:
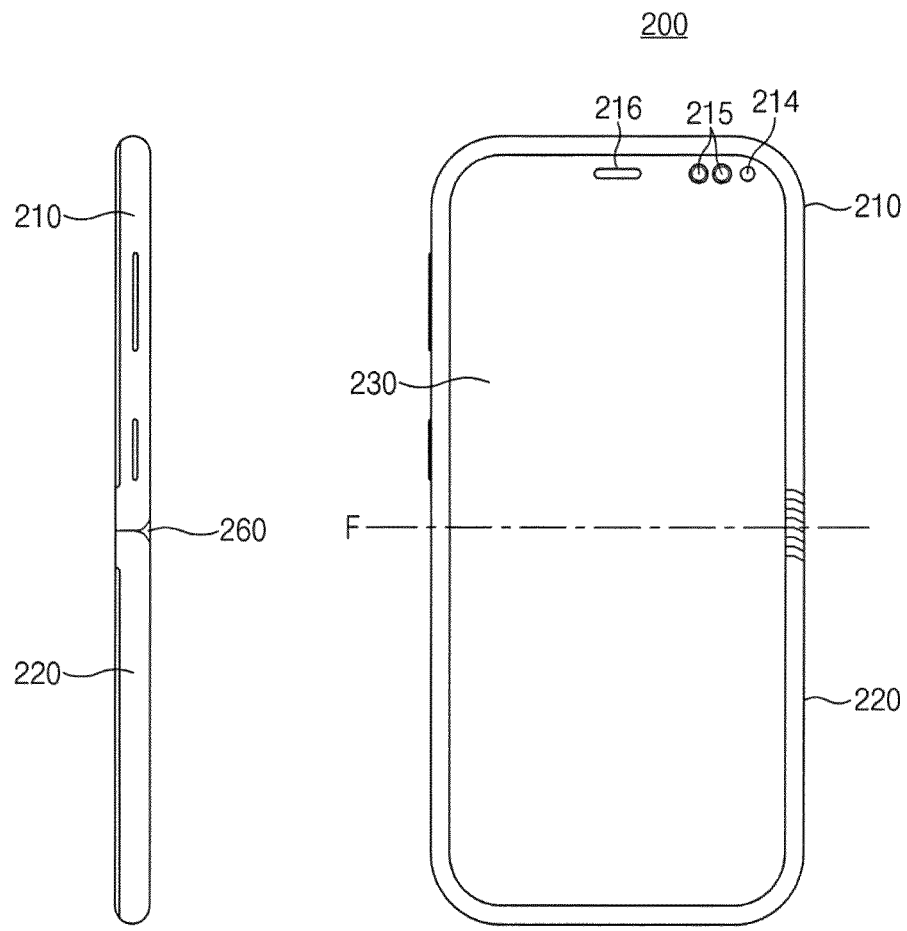
FIGS. 2A and 2B are views illustrating a foldable electronic device according to an embodiment.
Figure 2B:
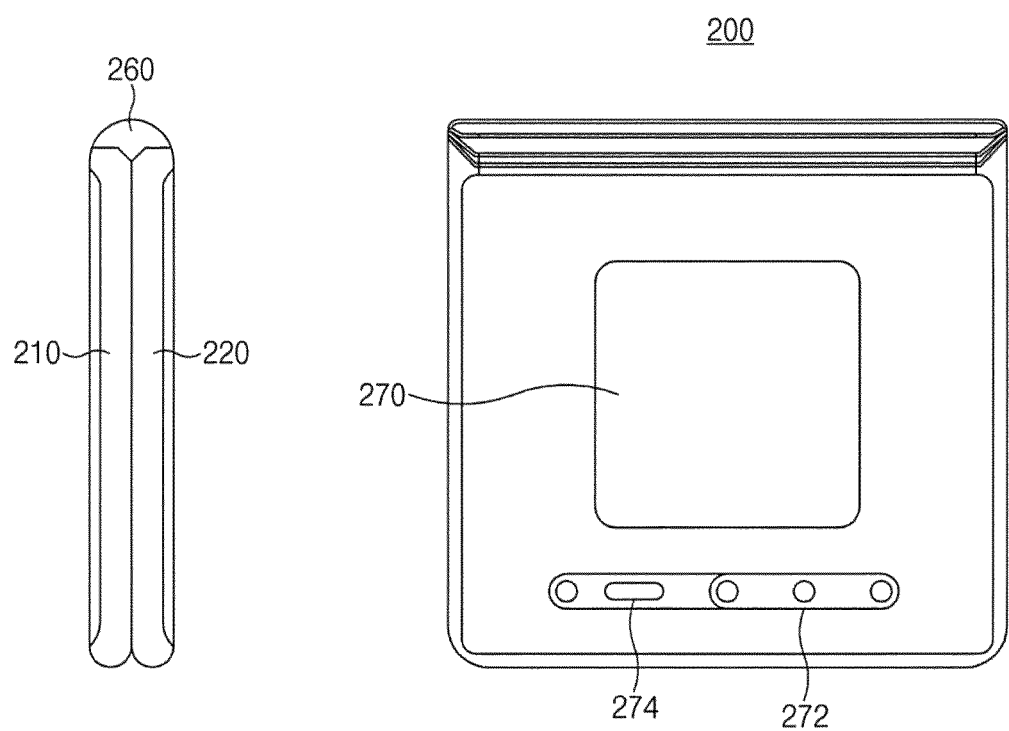

FIG. 2A is a view illustrating a flat state of an electronic device 200 according to an embodiment, and FIG. 2B is a view illustrating a folded state of the electronic device 200 according to an embodiment.

Referring to FIGS. 2A and 2B, the electronic device 200 according to an embodiment may include a first housing 210, a second housing 220, a hinge housing 260, and a display 230.

In an embodiment, the first housing 210 and the second housing 220 may be disposed on opposite sides of a folding axis "F," i.e., the folding axis "F" is located at the center thereof. The first housing 210 and the second housing 220 may be coupled to each other to be rotatable about the folding axis "F" through a hinge structure disposed in the hinge housing 260. The first housing 210 and the second housing 220 may be maintained in the flat state or may be folded with respect to each other.

In an embodiment, the display 230 may be disposed in a space defined by the first housing 210 and the second housing 220. The display 230 may be maintained in the flat state or may be folded along the folding axis "F".

In an embodiment, a camera 214 and a plurality of sensors 215 (e.g., the sensor module 176 of FIG. 1) may be disposed in at least one of the first housing 210 and the second housing 220. For example, the camera 214 and the plurality of sensors 215 may be disposed in at least a partial upper area of the first housing 210. As another example, at least some of the camera 214 and the plurality of sensors 215 may be disposed in at least a partial area of the first housing 210, and the remaining ones of the plurality of sensors 215 may be disposed in at least a partial area of the second housing 220.

In an embodiment, the camera 214 may be exposed through the front surface of the electronic device 200 via an opening provided at one corner of the first housing 210. The camera 214 may photograph the external environment of the electronic device. The camera 214 may generate image data corresponding to the captured external environment.

In an embodiment, the plurality of sensors 215 may be exposed through the front surface of the electronic device 200 via the opening provided at the one corner of the first housing 210 and/or the second housing 220 or may be disposed at a lower end of the display 230. The plurality of sensors 215 may include at least one of a proximity sensor, an illumination sensor, an iris recognition sensor, an ultrasonic wave sensor, and/or an indicator. The plurality of sensors 215 may detect information related to the external environment of the electronic device and/or biometric information of a user. The plurality of sensors 215 may generate sensing data based on the detected information.

In an embodiment, the first housing 210 may include a receiver 216 disposed through at least a partial area. The receiver 216 may transmit sound and/or voice corresponding to audio data received by the electronic device 200 such that the user may hear the sound and/or voice. Although not illustrated in FIGS. 2A and 2B, an ear jack hole, an external speaker module, an SIM card tray, an interface connector port, and/or at least one key button may be additionally disposed in the first housing 210 and/or the second housing 220.

In an embodiment, one or more components may be disposed on the rear surface of the electronic device 200 or may be exposed. For example, when the electronic device 200 is in the folded state, one or more components or sensors including a rear camera device 272 and/or a proximity sensor 274 may be exposed. As another example, when the electronic device 200 is in the folded state, at least a portion of a sub-display 270 may be exposed.

According to certain embodiments, the electronic device 200 may include a waterproof structure for waterproofing in the interior thereof.

Figure 3A:
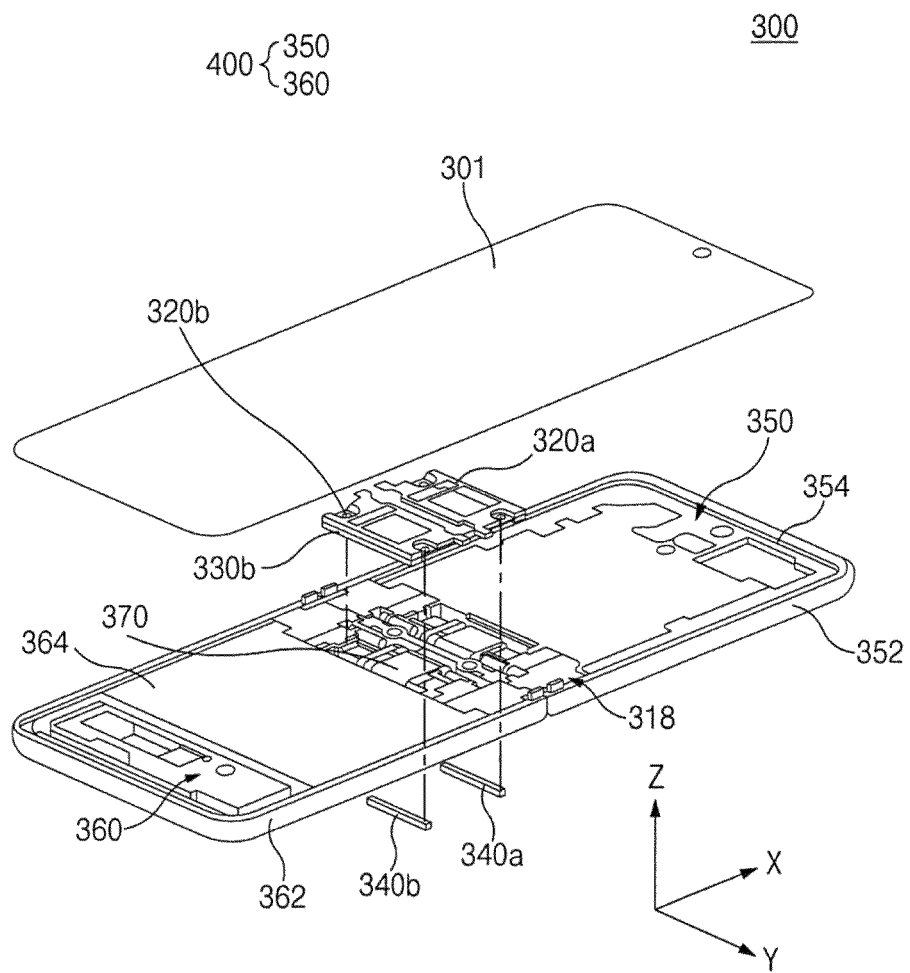
FIG. 3A is a perspective view illustrating a front surface of a foldable electronic device including a waterproof member according to an embodiment.
Figure 3B:
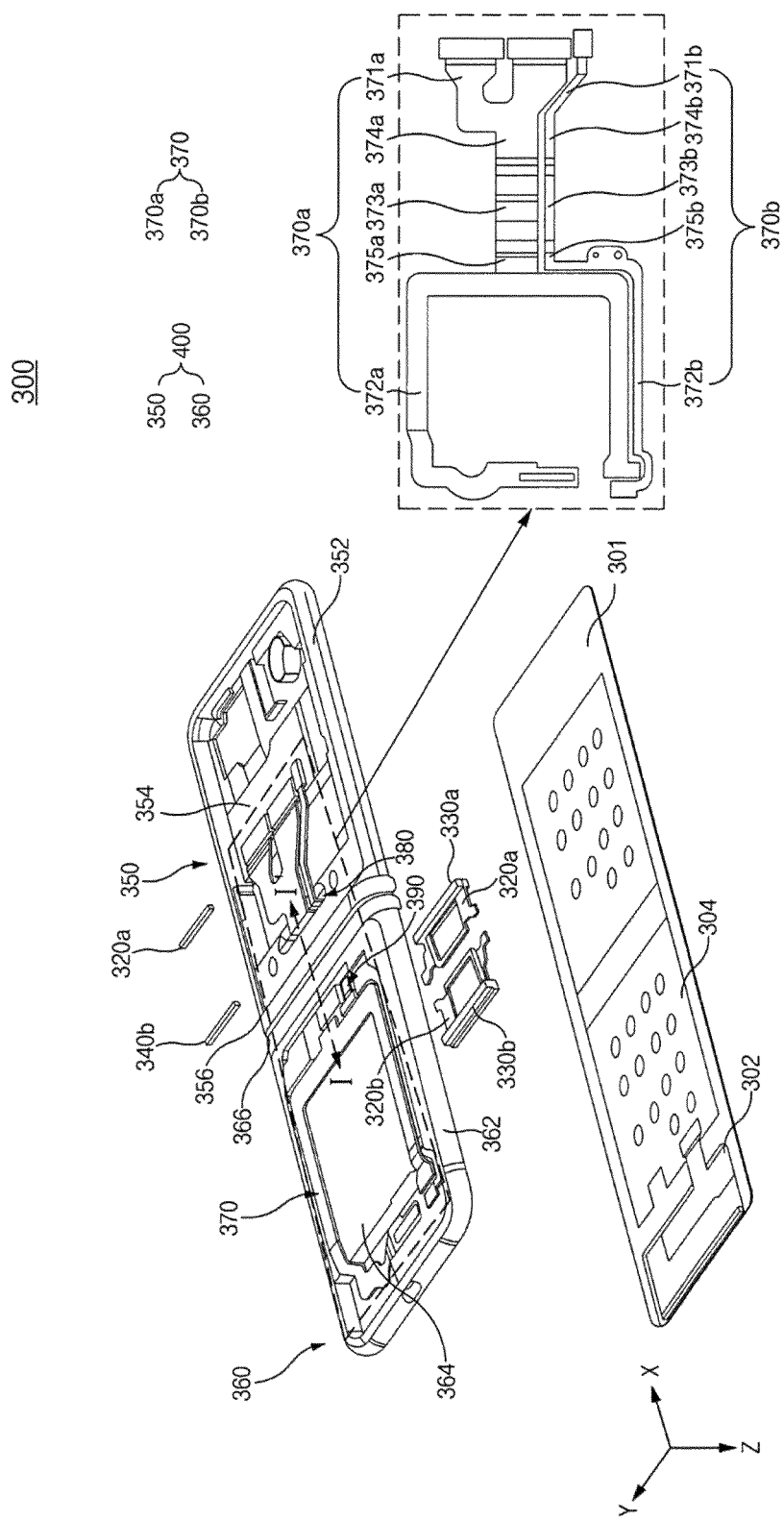
FIG. 3B is a perspective view illustrating a rear surface of a foldable electronic device including a waterproof member according to an embodiment.
Figure 4A:
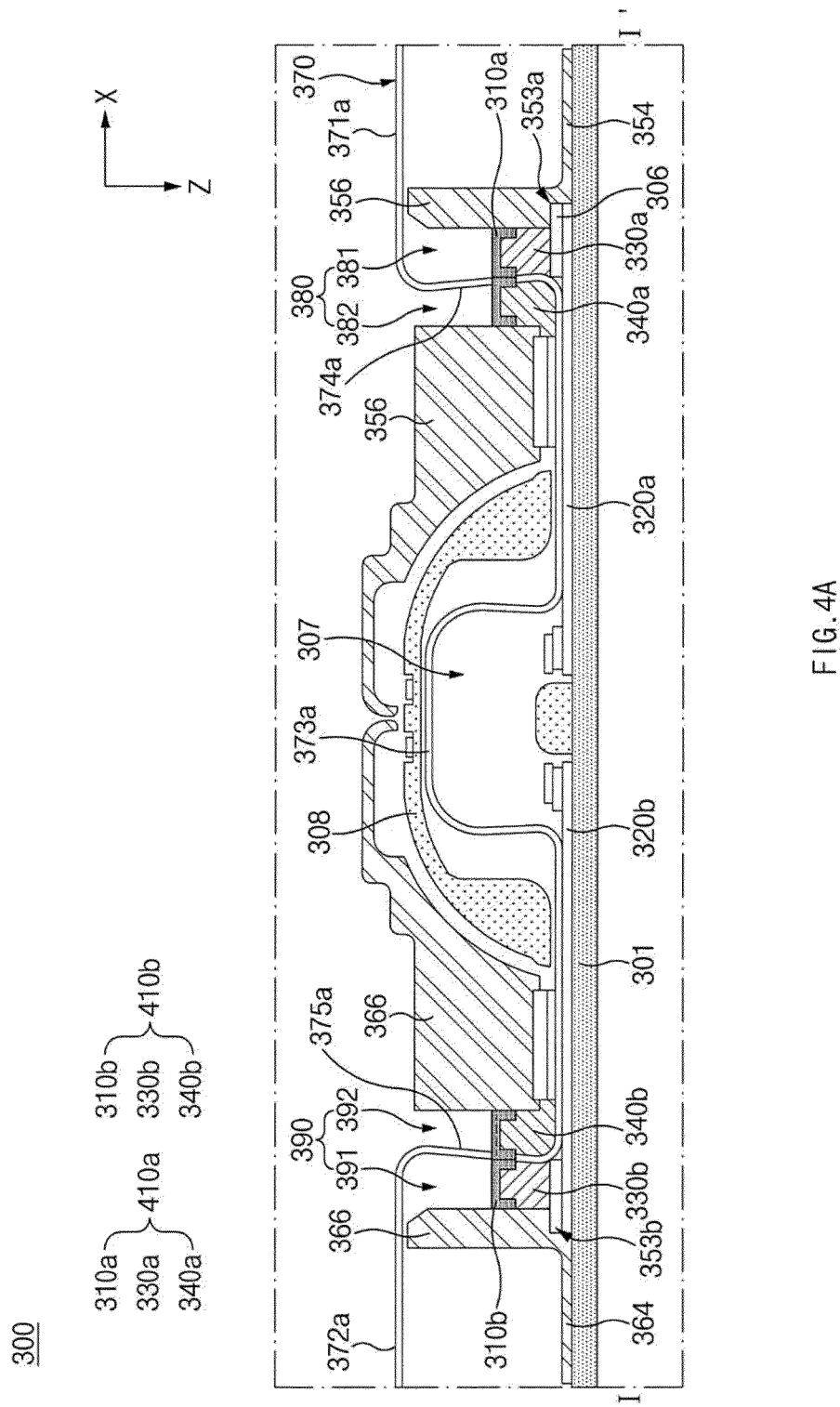
FIGS. 4A and 4B are cross-sectional views illustrating a foldable electronic device, taken along line I-I' in FIG. 3B.
Figure 4B:
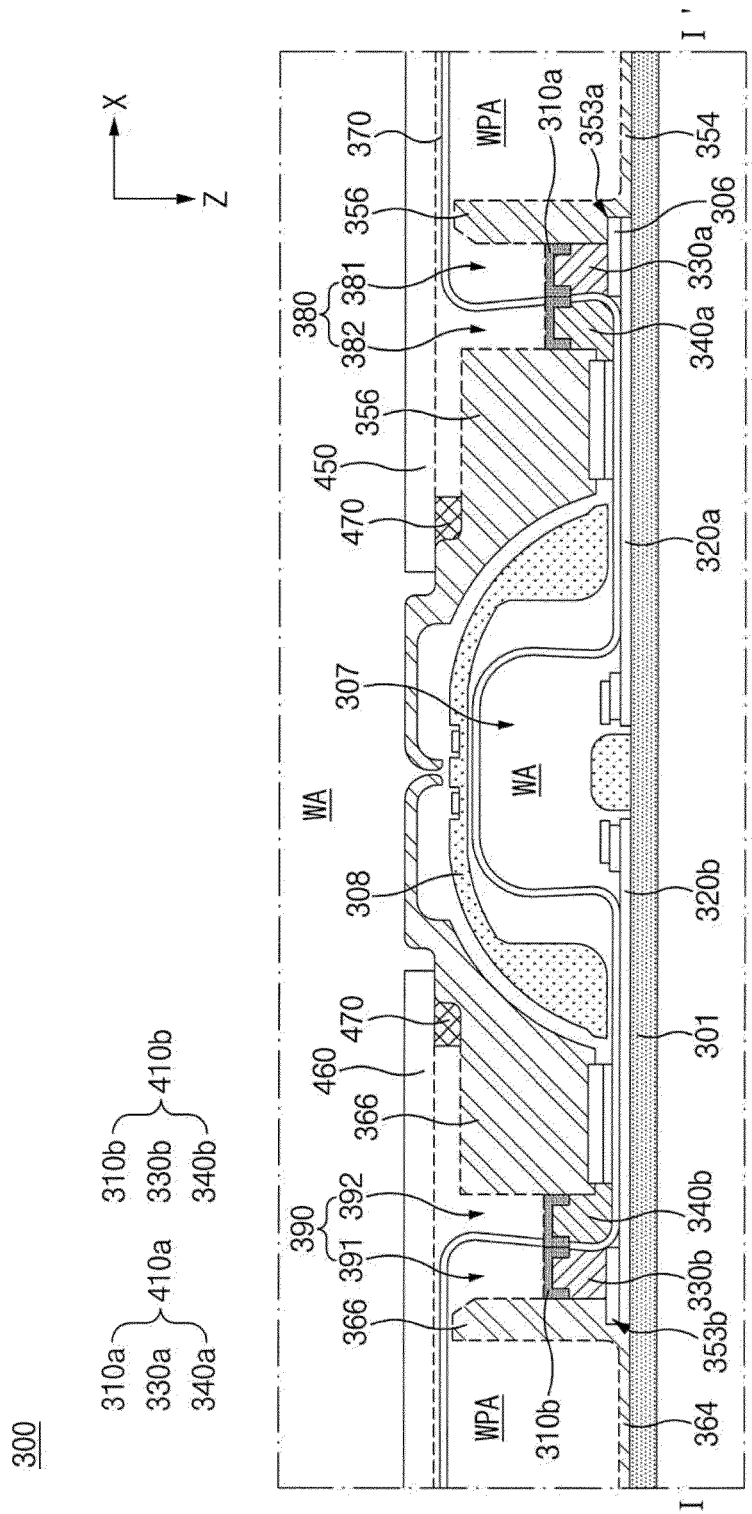

FIGS. 3A and 3B are exploded perspective views illustrating a foldable electronic device according to an embodiment including a waterproof structure. FIGS. 4A and 4B are cross-sectional views illustrating a foldable electronic device, taken along line I-I' in FIG. 3B.

Referring to FIGS. 3A to 4B, the foldable electronic device 300 of an embodiment may include a foldable housing 400, a first waterproof structure 410a, a second waterproof structure 410b, a first support bracket 320a, a second support bracket 320b, and a display 301.

According to an embodiment, the foldable electronic device 300 may be in-folded or out-folded, or both (or in/out-folded). When in-folded, the display 301 is folded inwards. When out-folded, the display 301 is folded outwards. When in/out-folded, a portion of the display 301 is folded inwards and a remaining portion of the display 301 is folded outwards. Hereinafter, an in-folding foldable electronic device will be described as an example.

The display 301 may be disposed over a first housing 350 and a second housing 360 included in the foldable housing 400. The display 301 may be flexible. For example, the area of the display 301 corresponding to the hinge housing 308, may be flexible. A heat dissipating layer that dissipates heat generated by the display 301, and a rear thin film layer 304 such as an embossing layer for reducing impacts applied to the display 301 may be formed on the rear surface of the display 301. According to an embodiment, the rear thin film layer 304 may not be formed in the area corresponding to the hinge housing 308 and may be separated from the hinge housing 308. According to another embodiment, the rear thin film layer 304 may not be separated from the area corresponding to the hinge housing 308 and may be integrally formed with the hinge housing 308. When heat emitted in interior spaces of the first housing 350 and the second housing 360 are uneven, the integral rear thin film layer 304 may rapidly diffuse heat of the housing (e.g., the first housing 350) emitting a relatively large amount of heat to the other housing (e.g., the second housing 360) that is relatively cool. Accordingly, hot spots may be reduced and local heat emission may be improved.

The foldable housing 400 may include the first housing 350 and the second housing 360 disposed while the hinge housing 308 being interposed therebetween. At least a portion of the hinge structure 318 may be disposed in an interior of the hinge housing 308. The hinge structure 318 may be connected to at least portions of the first housing 350 and the second housing 360 such that the first housing 350 and the second housing 360 are folded or unfolded with respect to the folding axis. Components such as the processor that drives the display 301, at least one printed circuit board 302, at least one flexible circuit board 370, a battery, a communication circuit, and an antenna may be disposed inside of the first housing 350 and/or the second housing 360.

The first housing 350 may be made of metal, ceramic, injection-molded material, and/or a combination thereof.

The first housing 350 may include a plurality of first side surface areas 352, a first bottom area 354, and a first cover area 356.

The plurality of first side surface areas 352 may be disposed to surround at least a portion of edges of the display 301. The first bottom area 354 may be disposed between the plurality of first side surface areas 352 to connect the plurality of first side surface areas 352. A portion of the display 301 (e.g., a side of the display 301) may be disposed to correspond to the first bottom area 354. The first cover area 356 may be disposed between one of the first side surface areas 352 and a second cover area 366. The first cover area 356 may have a specific curvature corresponding to the hinge housing 308. At least one first through-hole 380 that passes through the first cover area 356 may be disposed on one side of the first cover area 356.

The second housing 360 may be made of metal, ceramic, an injection-molded material, and/or a combination thereof. The second housing 360 may be made of a material that is the same as or different from that of the first housing 350. The second housing 360 may include a plurality of second side surface areas 362, a second bottom area 364, and the second cover area 366.

The plurality of second side surface areas 362 may be disposed to surround at least a portion of edges of the display 301 that are not surrounded by the plurality of first side surface areas 352. The second bottom area 364 may be disposed between the plurality of second side surface areas 362 to connect the plurality of second side surface areas 362. A portion of the display 301 (e.g., another side of the display 301) may be disposed to correspond to the second bottom area 364. The second cover area 366 may be disposed between one of the second side surface areas 362 and the first cover area 356. The second cover area 366 may have a specific curvature corresponding to the hinge housing 308. At least one second through-hole 390 that passes through the second cover area 366 may be disposed on one side of the second cover area 366.

The flexible circuit board 370 may be electrically connected to the printed circuit board seated in the foldable housing 400. Various components, such as those for driving the display, for communication, and for sensing may be disposed in the printed circuit board.

The flexible circuit board 370 may be disposed in the foldable housing 400 to pass through the first through-hole 380 and the second through-hole 390. The flexible circuit board 370 may first pass through one of the first through-hole 380 and the second through-hole 390 and then pass through the other one of the first through-hole 380 and the second through-hole 390.

The flexible circuit board 370 may be made of one flexible film or may be made of a multilayered flexible film. One or more flexible circuit boards 370 may be disposed in the foldable housing 400. For example, the flexible circuit board 370 may include a first flexible circuit board 370a and a second flexible circuit board 370b. One of the first flexible circuit board 370a and the second flexible circuit board 370b may be electrically connected to the printed circuit board, in which the various components for driving the display 301, for communication, and for sensing are disposed. The other one of the first flexible circuit board 370a and the second flexible circuit board 370b may be electrically connected to another printed circuit board, in which various components for communication and for sensing are disposed. For example, the first flexible circuit board 370a may be a main flexible circuit board electrically connected to the main circuit board, in which at least one component for driving the display 301 is disposed. The second flexible circuit board 370b may be a sub flexible circuit board electrically connected to a sub printed circuit board, in which the component for communication is disposed, but the components or the modules disposed in the main circuit board and the sub printed circuit board are not limited. The second flexible circuit board 370b may be formed along one side of the first flexible circuit board 370a.

The first flexible circuit board 370a may include first to fifth flexible areas 371a to 375a, and the second flexible circuit board 370b may include sixth to tenth flexible areas 371b to 375b. The first flexible area 371a and the sixth flexible area 371b may be disposed on a rear surface (e.g., the surface in the −Z direction of FIG. 3B) of the first bottom area 354 of the first housing 350. The second flexible area 372a and the seventh flexible area 372b may be disposed on a rear surface (e.g., the surface in the −Z direction of FIG. 3B) of the second bottom area 364 of the second housing 360. The second flexible area 372a of the first flexible circuit board 370a may be formed along an outskirt of the second bottom area 364 of the second housing 360, that is, outside a center part of the second bottom area 364 of the second housing 360. The seventh flexible area 372b may be formed along one side of the second flexible area. The third flexible area 373a and the eighth flexible area 373b may be disposed on a front surface (e.g., a surface in the +Z direction) of the first cover area 356 and/or the second cover area 366. The fourth flexible area 374a may be disposed between the first flexible area 371a and the third flexible area 373a, the ninth flexible area 374b may be disposed between the sixth flexible area 371b and the eighth flexible area 373b, and the fourth flexible area 374a and the ninth flexible area 374b may be held in the first through-hole 380. Because the fourth flexible area 374a and the ninth flexible area 374b are held in the first through-hole 380, they may have lengths (or widths) that are smaller than the length of the first through-hole 380. The fifth flexible area 375a may be disposed between the second flexible area 372a and the third flexible area 373a, the tenth flexible area 375b may be disposed between the seventh flexible area 372b and the eighth flexible area 373b, and the fifth flexible area 375a and the tenth flexible area 375b may be held in the second through-hole 390. Because the fifth flexible area 375a and the tenth flexible area 375b are held in the second through-hole 390, they may have lengths (or widths) that are smaller than the length of the second through-hole 390.

The first waterproof structure 410a may be disposed in the interior of the first through-hole 380, in which the fourth flexible area 374a and the ninth flexible area 374b are held, and the second waterproof structure 410b may be disposed in the interior of the second through-hole 390, in which the fifth flexible area 375a and the tenth flexible area 375b are held.

The first waterproof structure 410a may prevent fluids from being introduced from the outside to the inside of the first housing 350 due to the first through-hole 380, through which the flexible circuit board 370 passes. In this regard, the first waterproof structure 410a may include a first waterproof member 330a, a second waterproof member 340a, and a first sealing member 310a.

The second waterproof structure 410b may prevent fluids from being introduced from the outside to the inside of the second housing 360 due to the second through-hole 390, through which the flexible circuit board 370 passes. In this regard, the second waterproof structure 410b may include a third waterproof member 330b, a fourth waterproof member 340b, and a second sealing member 310b.

The first waterproof member 330a may be inserted into a first opening area 381 of the first through-hole 380. The second waterproof member 340a may be inserted into a second opening area 382 of the first through-hole 380. The first sealing member 310a may be inserted into (or filled in) the first through-hole 380. The third waterproof member 330b may be inserted into a third opening area 391 of the second through-hole 390. The fourth waterproof member 340b may be inserted into a fourth opening area 392 of the second through-hole 390. The second sealing member 310b may be inserted into (or filled in) the second through-hole 390.

Hereinafter, for convenience of description, the first waterproof structure 410a will be primarily described, and the description also may be applied to the second waterproof structure 410b. For example, the description of the first waterproof member 330a of the first waterproof structure 410a may be applied to the third waterproof member 330b of the second waterproof structure 410b. The first waterproof structure 410a and the second waterproof structure 410b may be made of the same or symmetrical shapes and/or the same material, but the disclosure is not limited thereto. For example, the description of the first sealing member 310a may be applied to the description of the second sealing member 310b, but their shapes may be different. Alternatively, although not illustrated, the electronic device 300 may include only one waterproof structure (e.g., one of the first waterproof structure 410a and the second waterproof structure 410b) depending on the particular implementation of the electronic device 300. An ordinary person in the art will understand that the number of the waterproof structures is not limited by the disclosed embodiments.

The first waterproof member 330a may be disposed between the flexible circuit board 370 and the first support bracket 320a. The second waterproof member 340a may be disposed to face the first waterproof member 330a in the first direction (e.g., the X direction) while the flexible circuit board 370 is interposed therebetween. The flexible circuit board 370 may be disposed between the second waterproof member 340a and the first support bracket 320a. The flexible circuit board 370 may include one film or a plurality of films.

In an embodiment, at least any one of the first waterproof member 330a and/or the second waterproof member 340a may be made of an elastic material, such as polymer or injection-molded material, or strong material such as metal. The first elastic waterproof member 330a may be deformed along the shape of a wall surface of the first through-hole 380. The elastic second waterproof member 340a may be deformed along the shape of another wall surface of the first through-hole 380. The first waterproof member 330a and the second waterproof member 340a may be deformed to be attached to each other while the flexible circuit board 370 is interposed therebetween. The first waterproof member 330a and the second waterproof member 340a may block a space between the flexible circuit board 370 and the first housing 350 without having any apertures. Accordingly, fluids may be prevented from penetrating between the flexible circuit board 370 disposed in the first through-hole 380 and the first housing 350. Materials of the first waterproof member 330a and the second waterproof member 340a according to an embodiment may be the same or different. For example, the first waterproof member 330a and/or the second waterproof member 340a may be made of materials of different elasticity degrees.

The first sealing member 310a may be inserted into (or filled in) the area between the first waterproof member 330a and the second waterproof member 340a, and the flexible circuit board 370. The first sealing member 310a may be inserted into (or filled in) the area between the first waterproof member 330a, the second waterproof member 340a, and the first housing 350. Alternatively, the first sealing member 310a may be inserted (or filled) between the first waterproof member 330a and the second waterproof member 340a. The first sealing member 310a may be formed by solidifying a material having a viscosity that is lower than those of the first waterproof member 330a and the second waterproof member 340a. According to an embodiment, the first sealing member 310a may be formed by applying a cured in-place gasket (CIPG) in liquid form to the first through-hole 380 and optically curing and solidifying it. According to another embodiment, the first sealing member 310a may be cured through thermal curing, through wet curing, or by applying a curing agent such as a releasing liquid.

According to an embodiment, during the process of applying the first sealing member 310a, the application area of the first sealing member 310a, which at the time is liquid, may be limited by the first waterproof member 330a and the second waterproof member 340a. Accordingly, the first sealing member 310a may be prevented from being applied to areas outside the first through-hole 380, or leakage of the first sealing member 310a to outside the first through-hole 380 may be minimized.

According to an embodiment, a sub-display or a first rear cover 450, as illustrated in FIG. 4B of the first housing 350, may be disposed on the rear surface (e.g., the surface in the −Z direction of FIG. 3B), and the sub-display or a second rear cover 460 may be disposed on the rear surface of the second housing 360. The first rear cover 450 and the second rear cover 460 may cover the flexible circuit board 370 to prevent the flexible circuit board 370 from being exposed through the rear surface of the electronic device 300. A cover waterproofing member 470 may be disposed between a first hinge cover area 356 of the first housing 350 and the first rear cover 450, and between a second hinge cover area 366 of the second housing 360 and the second rear cover 460. The cover waterproofing member 470 may stably provide waterproofing by preventing fluids from being introduced toward the flexible circuit board 370.

According to an embodiment, the electronic device 300 may be classified into a waterproof area WPA and a non-waterproof area WA by the first waterproof structure 410a and the second waterproof structure 410b. For example, a dashed area in FIG. 4B may be the waterproof area WPA, and the remaining area may be the non-waterproof area WA.

The non-waterproof area WA may overlap the first cover area 356 and the second cover area 366 disposed between the first through-hole 380 and the second through-hole 390, and the waterproof area WPA may be the area outside the non-waterproof area WA. Because the waterproof area WPA may be enclosed without any aperture by the first waterproof structure 410a and the second waterproof structure 410b, stable waterproofing and dustproofing may be provided.

The electronic device 300 according to an embodiment may include the first support bracket 320a and the second support bracket 320b that support the flexible circuit board 370. The first support bracket 320a may be assembled to fit with the first waterproof member 330a, may be coupled to the first waterproof member 330a via a bonding layer 306, or may be integrally injection-molded with the first waterproof member 330a. Because the first support bracket 320a is made of a relatively strong material (e.g. metal), the first waterproof member 330a may be smoothly assembled when being assembled in the first through-hole 380. According to an embodiment, the description of the first support bracket 320a may be applied to the description of the second support bracket 320b.

The first support bracket 320a may be disposed between the first cover area 356 and the display 301, and the second support bracket 320b may be disposed between the second cover area 366 and the display 301. The first support bracket 320a may be disposed in a first seating recess 353a formed in the first housing 350, and the second support bracket 320b may be disposed in a second seating recess 353b formed in the second housing 360. Because the first support bracket 320a and the second support bracket 320b are formed to cover groove or hole areas formed in the first housing 350 and the second housing 360, respectively, the rear surface of the display 301 may be uniformly supported. For example, the first support bracket 320a may be disposed to overlap the first through-hole 380, and may be disposed to overlap at least a portion of the hinge recess 307, through which a portion of the flexible circuit board 370 is received in the hinge housing 308. Accordingly, the first support bracket 320a and the second support bracket 320b may prevent the display 301 from being deformed by external forces.

The thickness of the first support bracket 320a may vary according to the depth of the hinge recess 307 and/or the first through-hole 380. For example, the thickness of the first support bracket 320a may be the larger in the hinge recess 307, which has a larger depth than the first through-hole 380. According to an embodiment, the description of the first support bracket 320a may be applied to the description of the second support bracket 320b, but an ordinary person in the art will easily understand that shapes and/or materials of the first support bracket 320a and the second support bracket 320b can be implemented in various different ways.

Figure 5A:
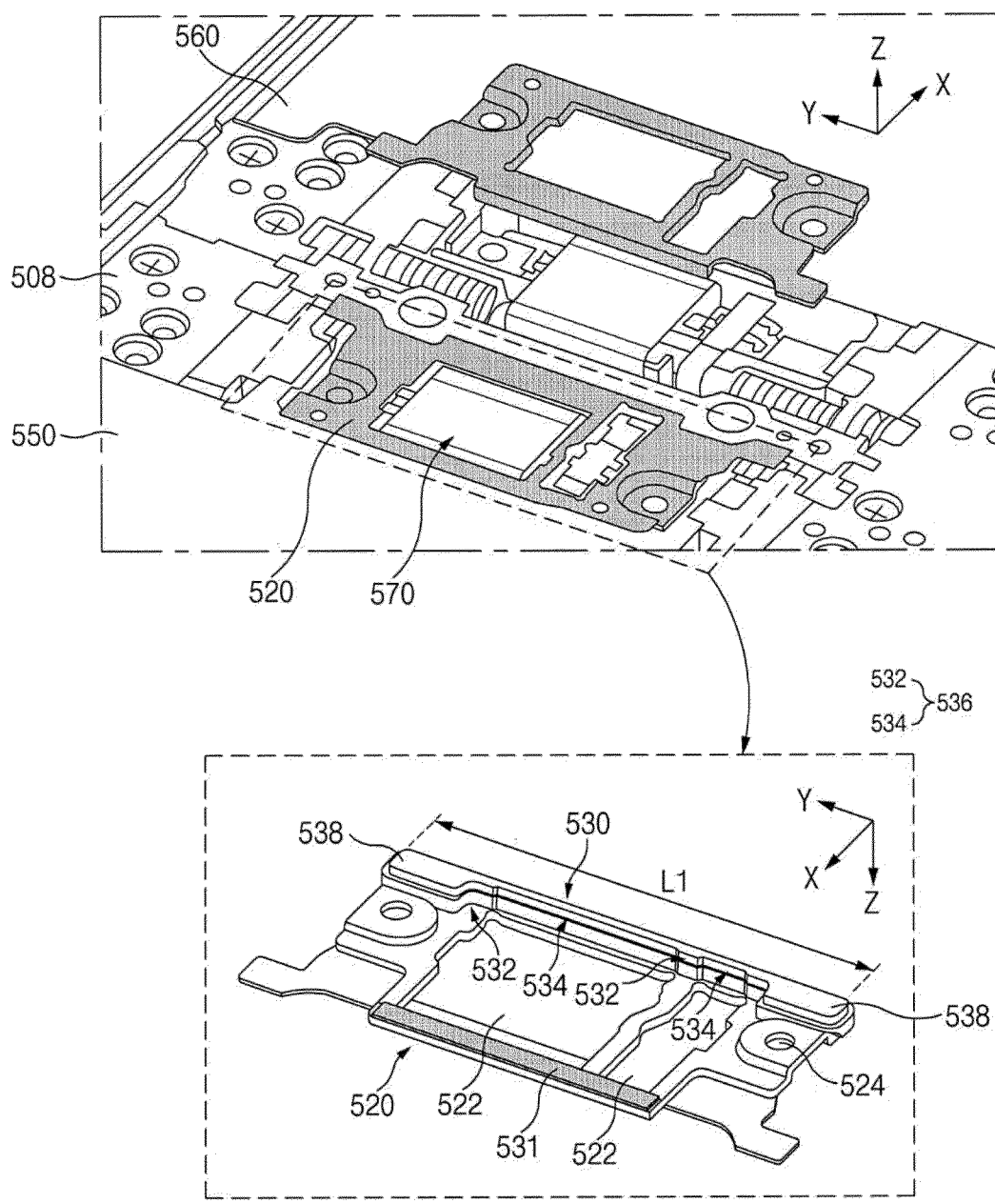
FIGS. 5A and 5B are perspective views illustrating first and second waterproof members included in a foldable electronic device according to an embodiment in detail.
Figure 5B:
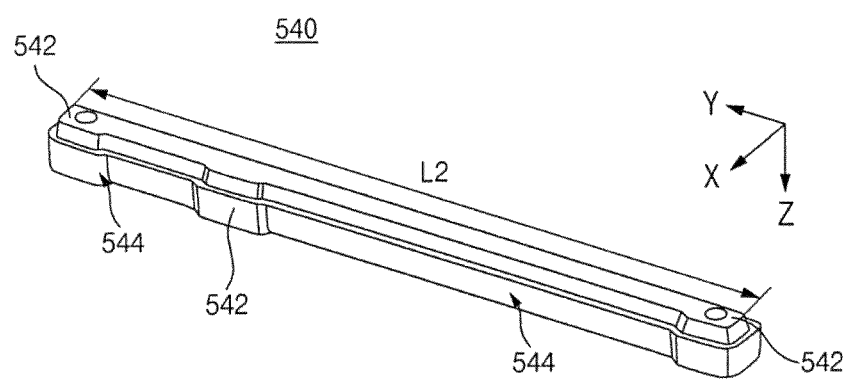

FIGS. 5A and 5B are perspective views illustrating the support bracket, the first waterproof member, and the second waterproof member according to an embodiment in detail. The broader top view of FIG. 5A is a view illustrating when the support bracket integrally formed with the first waterproof member is coupled to the housing. The enlarged bottom view of FIG. 5A is an enlarged view, in which the support bracket integrally formed with the first waterproof member is rotated by 180 degrees with respect to the second direction (e.g., the Y direction).

A support bracket 520 (e.g., the first support bracket 320a of FIGS. 4A and 4B), as illustrated in FIG. 5A, may be disposed to overlap a hinge structure 508. The support bracket 520 may include at least one bracket hole 522, in which an area corresponding to the flexible circuit board 570 is opened. The bracket hole 522 may be formed to pass through at least a portion of the flexible circuit board 570. That is, the bracket hole 522 may be formed in the at least one flexible circuit board. When a plurality of flexible circuit boards 570 are provided, the bracket holes 522 may be formed in each of the plurality of flexible circuit boards 570. Furthermore, an elastic member 531 made of a rubber material may be disposed on the support bracket 520. The elastic member 531 may face the first waterproof member 530 while the bracket hole 522 is interposed therebetween. Furthermore, the support bracket 520 may further include a coupling hole 524, into which a coupling member may be inserted. The support bracket 520 may be coupled to the first housing 550 through the coupling member. For example, when the coupling member is a screw, a screw thread may be formed at at least a portion of the inner side of the coupling hole 524.

According to an embodiment, the first waterproof member 530 (e.g., the first waterproof member 330a of FIGS. 4A and 4B) may be disposed on the support bracket 520 not to overlap the bracket hole 522. The first waterproof member 530 may be made of a material having lower strength and higher elasticity than the support bracket 520. The area of the first waterproof member 530 may be larger than the area of the second water proof member 540 (e.g., the second waterproof member 340a of FIGS. 4A and 4B). The length of the first waterproof member 530 may be larger than the length of the second waterproof member 540. Because the first waterproof member 530 is coupled to the support bracket 520 having high strength, the degree of freedom in deformation of the first waterproof member 530 may be lowered. Accordingly, even when the first waterproof member 530 is longer than the second waterproof member 540, ease of assembling the first waterproof member 530 may be achieved.

The second waterproof member 540 may be made of a material having lower strength and higher elasticity than the support bracket 520. The second waterproof member 540 may be made of the same material as that of the first waterproof member 530. Then, the length L2 of the second waterproof member 540 may be smaller than the length L1 of the first waterproof member 530. Because the second waterproof member 540 having the shorter length has low degree of freedom in deformation, ease of assembling the second waterproof member 540 may be achieved.

According to an embodiment, the first waterproof member 530 may include a first waterproof area 536, and second waterproof areas 538 located on opposite sides of the first waterproof area 536. At least one side surface of the first waterproof area 536 may have a convexo-concave shape. For example, the side surface of the first waterproof area 536, which faces the second waterproof area 538, may have a convexo-concave shape. The first waterproof area 536 may have first bosses 532 and one or more first insertion grooves 534. The first bosses 532 may correspond to an area facing the second waterproof member 530 without any flexible circuit board 570, and the first insertion grooves 534 may correspond to an area facing the second waterproof member 540 with the flexible circuit board 570 being interposed therebetween. Because the second waterproof area 538 has a width corresponding to widths of the first through-hole (e.g., the first through-hole 380 of FIGS. 4A and 4B) and the second through-hole (e.g., the second through-hole 390 of FIGS. 4A and 4B), it may have a width that is larger than that of the first waterproof area 536. The second waterproof area 538 may directly face a side surface of the second waterproof member 540 without any flexible circuit board 570.

At least one side surface of the second waterproof member 540 may have a convexo-concave shape. For example, the side surface of the second waterproof member 540 facing the first waterproof area 536 of the first waterproof member 530, may have a convexo-concave shape. The second waterproof member 540 may include second bosses 542, and second insertion grooves 544 disposed between the second bosses 542. The second bosses 542 may correspond to an area facing the first waterproof member 530 without any flexible circuit board 570. The second insertion grooves 544 may correspond to an area facing the first waterproof member 530 while the flexible circuit board 570 is interposed therebetween.

Figure 6:
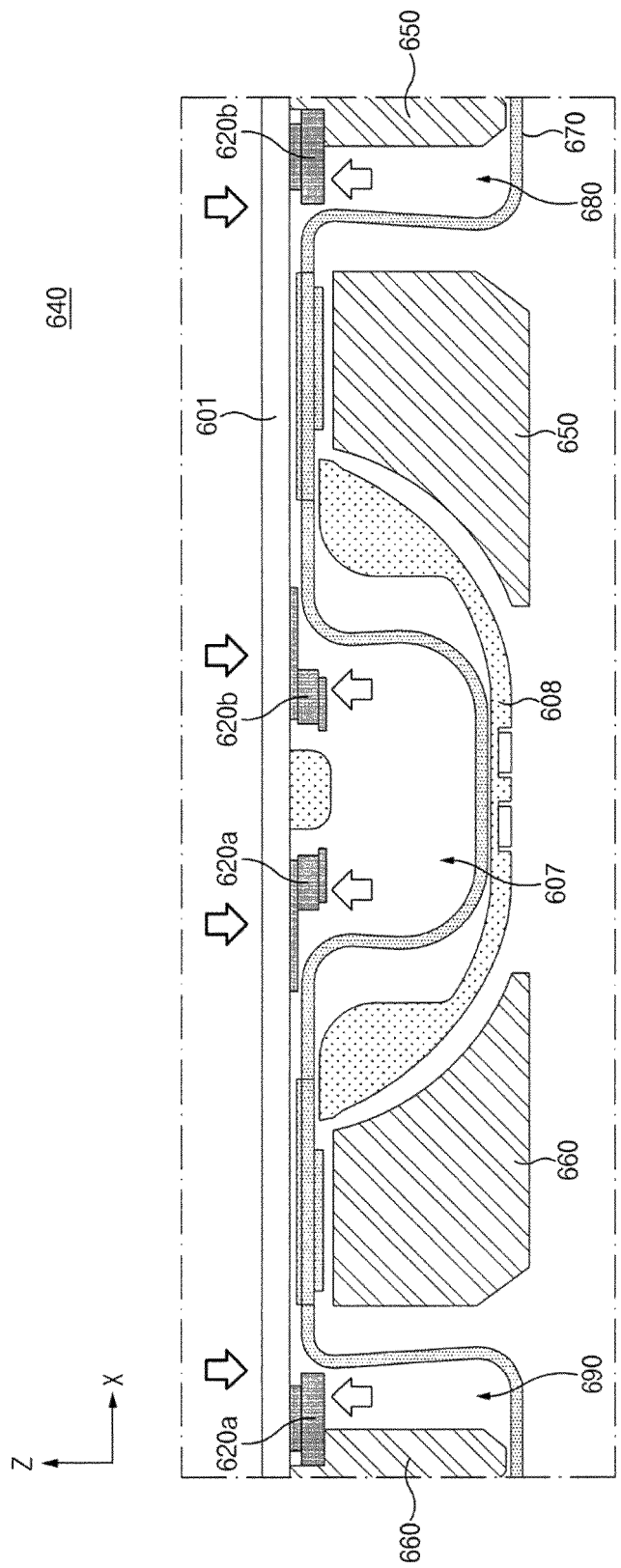
FIG. 6 is a view illustrating an electronic device according to an embodiment including a support bracket.

FIG. 6 is a view illustrating a disposition relationship of the support bracket and a display 601 of the electronic device.

Referring to FIG. 6, an electronic device 640 according to an embodiment may include a first housing 650 and a second housing 660 disposed while a hinge housing 608 is interposed therebetween. The first housing 650 may include a first through-hole 680, in which a flexible circuit board 670 is held, the second housing 660 may include a second through-hole 690, in which the flexible circuit board 670 is held, and the hinge housing 608 may include a hinge recess 607, in which the flexible circuit board 670 is held.

The electronic device 640 according to certain embodiments may include a first support bracket 620a and a second support bracket 620b that support the flexible circuit board 670. Because the first support bracket 620a supports the display 601 in an area corresponding to the hinge recess 607 and the second through-hole 690, the display 601 may maintain a flattened shape. Because the second support bracket 620b supports the display 601 in an area corresponding to the hinge recess 607 and the first through-hole 680, the display 601 may maintain the flattened shape. Furthermore, cracks may be prevented in the display 601 even when pressure is applied to the screen of the display 601 from, for example, external impacts.

Figure 7A:
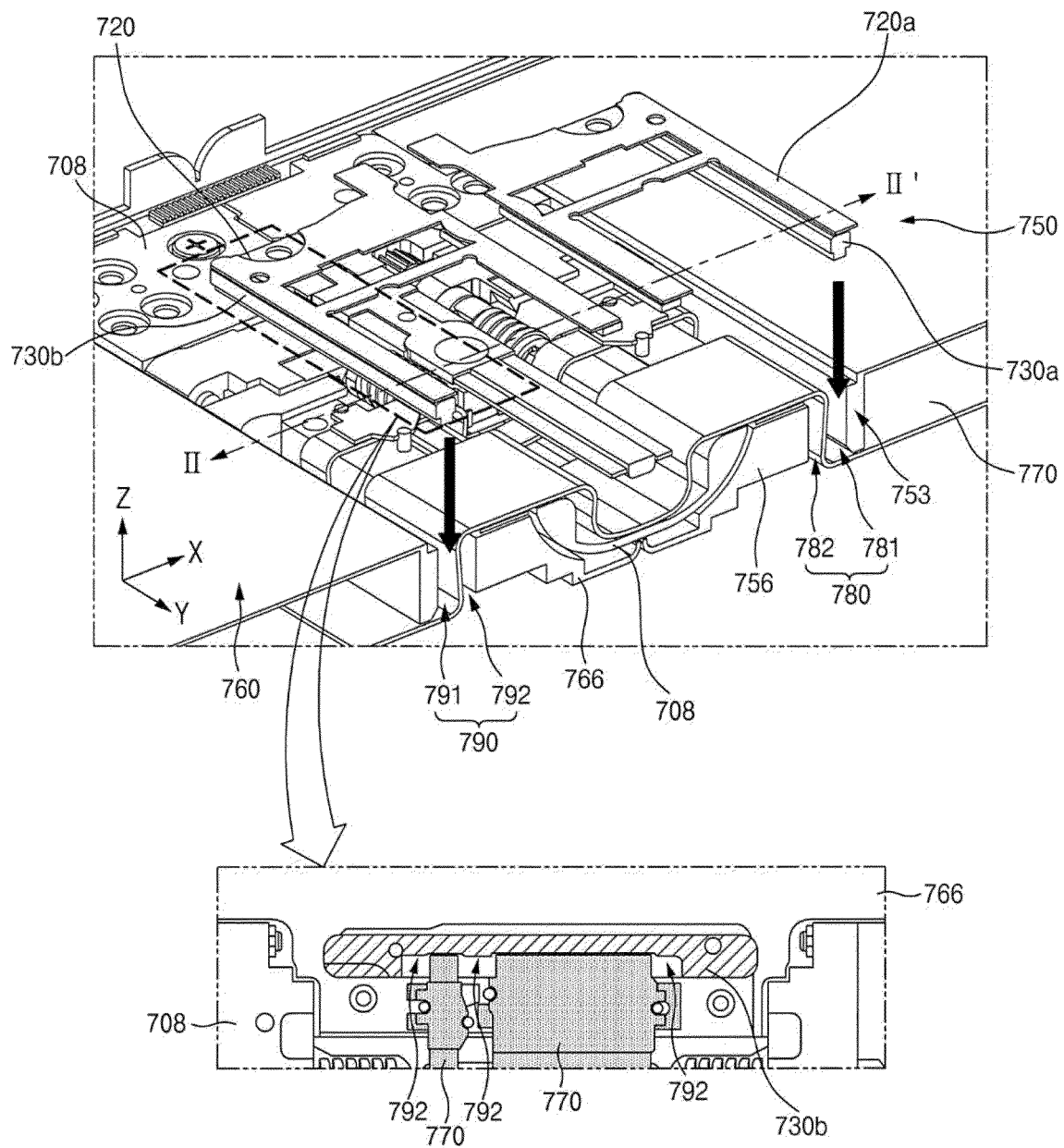
FIGS. 7A to 7F are views illustrating a method for assembling a foldable electronic device according to an embodiment.

FIGS. 7A to 7F are views illustrating a method for assembling a foldable electronic device according to an embodiment. Meanwhile, the enlarged view disposed at the lower portion of FIG. 7A is a view in the direction (e.g., the +Z direction), in which the support bracket is omitted.

Hereinafter, for convenience of description of the method for assembling an electronic device, a first housing 750, a first support bracket 720a, a first waterproof member 730a, a second waterproof member 740a, and a first sealing member 710a will be primarily described, and the description may be applied to a second housing 760, a second support bracket 720b, a third waterproof member 730b, a fourth waterproof member 740b, and a second sealing member 710b. For example, the description of the first housing 750 may be applied to the description of the second housing 760, the description of the first support bracket 720a may be applied to the description of the second support bracket 720b, the description of the first waterproof member 730a may be applied to the description of the third waterproof member 730b, the description of the second waterproof member 740a may be applied to the description of the fourth waterproof member 740b, and the description of the first sealing member 710a may be applied to the description of the second sealing member 710b.

Figure 7B:
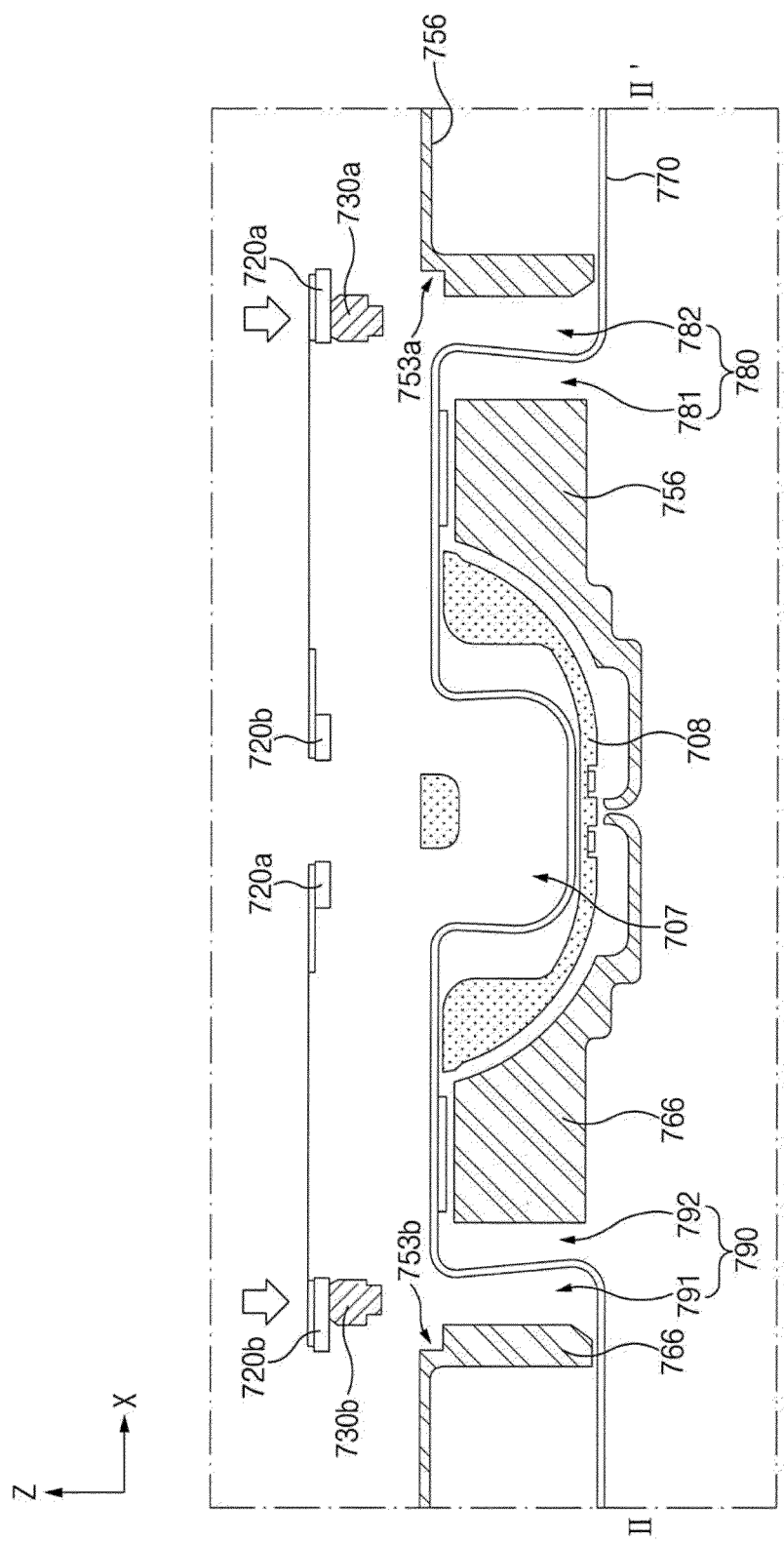

As illustrated in FIGS. 7A and 7B, a flexible circuit board 770 may be disposed in the first housing 750 and the second housing 760 when the rear surfaces (e.g., surfaces in the −Z direction of FIG. 7A) of the first housing 750 and the second housing 760 face the ground. The flexible circuit board 770 may be held in a first through-hole 780 that passes through a first cover area 756 of the first housing 750, a second through-hole 790 that passes through a second cover area 766 of the second housing 760, and a hinge recess 707, in which a hinge housing 708 is disposed.

Figure 7C:
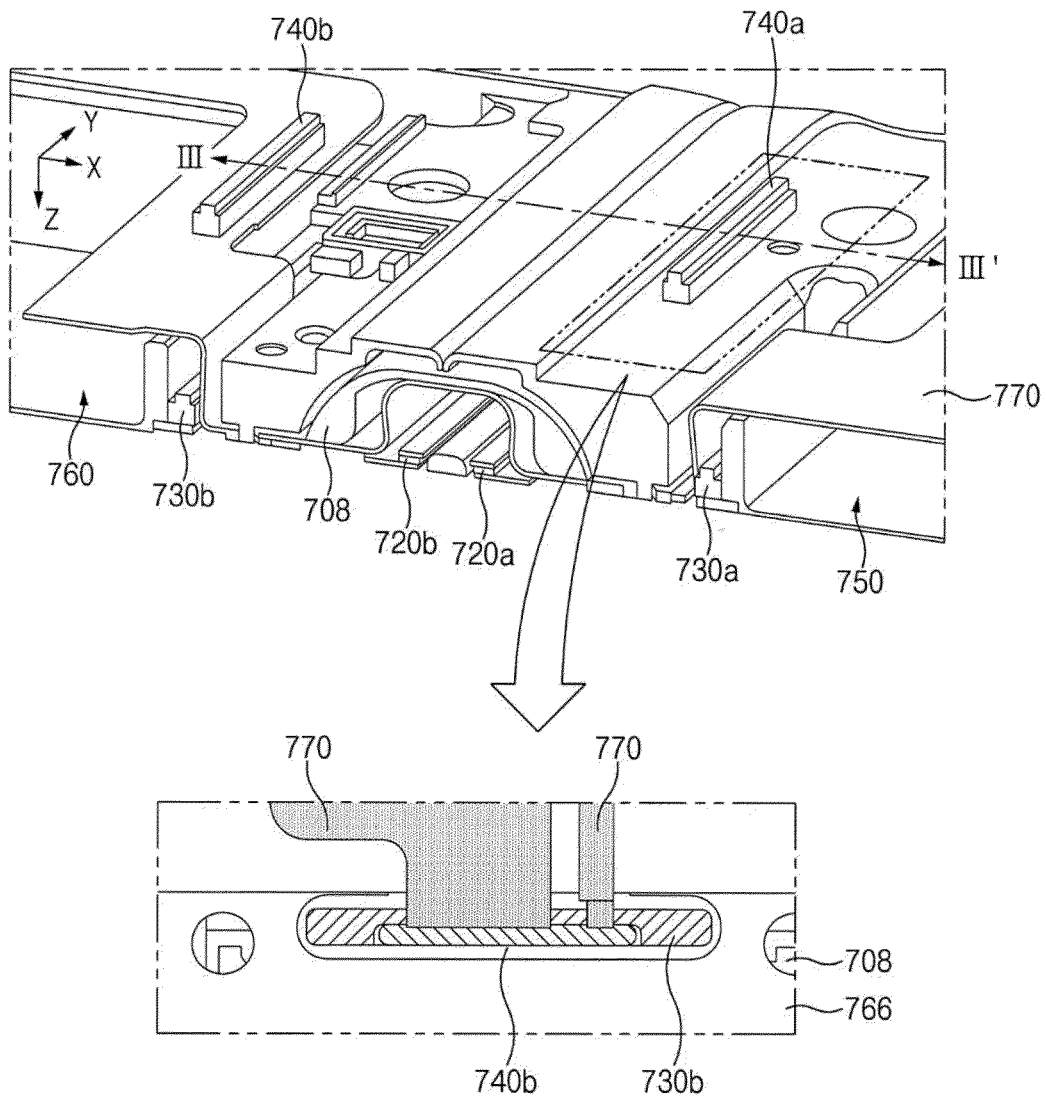
Figure 7D:
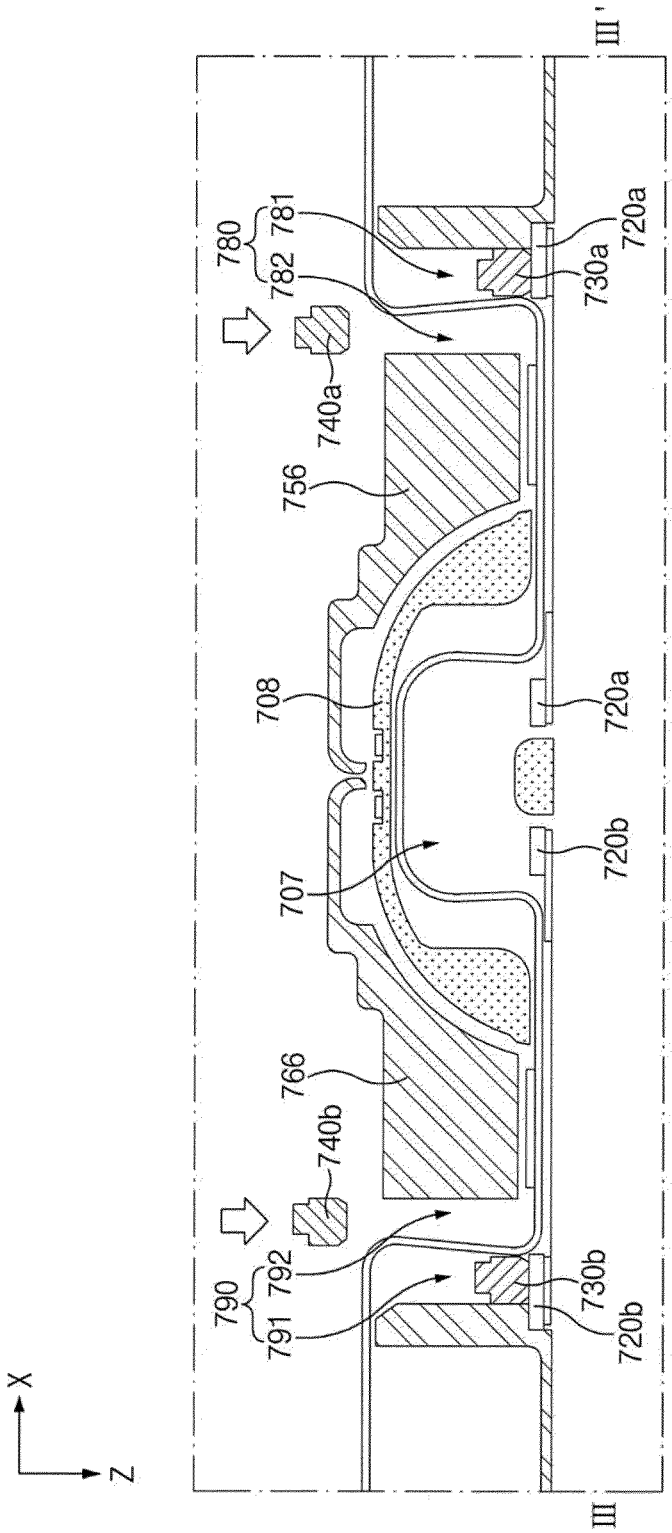

Thereafter, the first support bracket 720a coupled to the first waterproof member 730a may be assembled on the front surface (e.g., a surface in the +Z direction of FIG. 7B) of the first housing 750. The first support bracket 720a may be disposed on a seating surface defined by a first seating recess 753a formed on the front surface of the first housing 750. A partial area of the first support bracket 720a may contact or face the seating surface. Accordingly, the first waterproof member 730a coupled to the first support bracket 720a may be inserted into a first opening area 781 of the first through-hole 780 toward the first surface (e.g., a surface in the +Z direction) of the flexible circuit board 770. Then, the first waterproof member 730a may have a length corresponding to the length of the first through-hole 780. The first waterproof member 730a inserted into the first opening area 781 of the first through-hole 780 may be disposed to surround at least three surfaces of the flexible circuit board 770. The first waterproof member 730a may have a "U" or an inverse "U" shape to cover a partial area of the flexible circuit board 770 while not being covered by the flexible circuit board 770 when viewed from the direction (or the direction of the front surfaces of the first housing 750 and the second housing 760) of the display 701. The first waterproof member 730a may be disposed in a non-overlapping area of the first through-hole 780, one in which is not covered by the flexible circuit board 770. Thereafter, because the first housing 750 coupled to the first support bracket 720a is rotated by 180 degrees about the first direction (e.g., the X direction) or the second direction (e.g., the Y direction), the front surface of the first housing 750 may face the ground as illustrated in FIGS. 7C and 7D. The second waterproof member 740a may be inserted into a second opening area 782 of the first through-hole 780 toward the second surface (or rear surface) (e.g., the surface in the −Z direction) of the flexible circuit board 770 when the front surface of the first housing 750 faces the ground. Then, the first waterproof member 730a may be disposed to surround at least three side surfaces of the second waterproof member 740a. The second waterproof member 740a may be disposed in the "U" shape of the first waterproof member 730a such that a partial area thereof is covered by the flexible circuit board 770 when viewed from the direction (or the direction of the front surfaces of the first housing 750 and the second housing 760) of the display 701. The second waterproof member 740a may be disposed to be surrounded by the first waterproof member 730a and one surface of the flexible circuit board 770 on the rear surface of the flexible circuit board 770. An area occupied by the first waterproof member 730a and not by the second waterproof member 740a may be larger in the non-overlapping area of the first through-hole 780, which is not covered by the flexible circuit board 770.

The length of the second waterproof member 740a may be smaller than the entire length of the first through-hole 780, and may be larger than the entire width of the flexible circuit board 770 inserted into the first through-hole 780. Because the length of the second waterproof member 740a is smaller than the length of the first waterproof member 730a, the second waterproof member 740a overlaps the first waterproof member 730a by a relatively small degree, such that ease of assembling with the first waterproof member 730a may be enhanced.

Figure 7E:
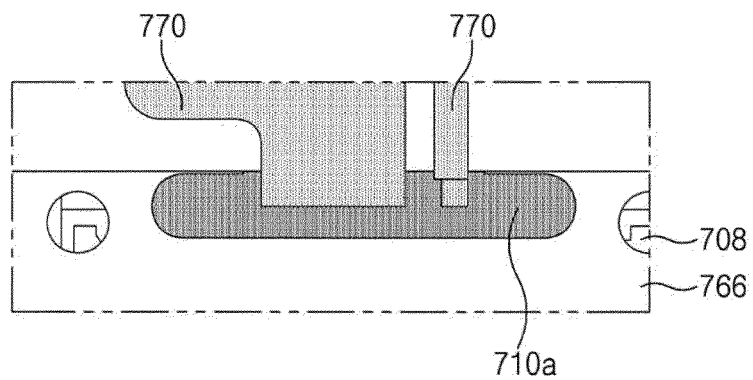
Figure 7F:
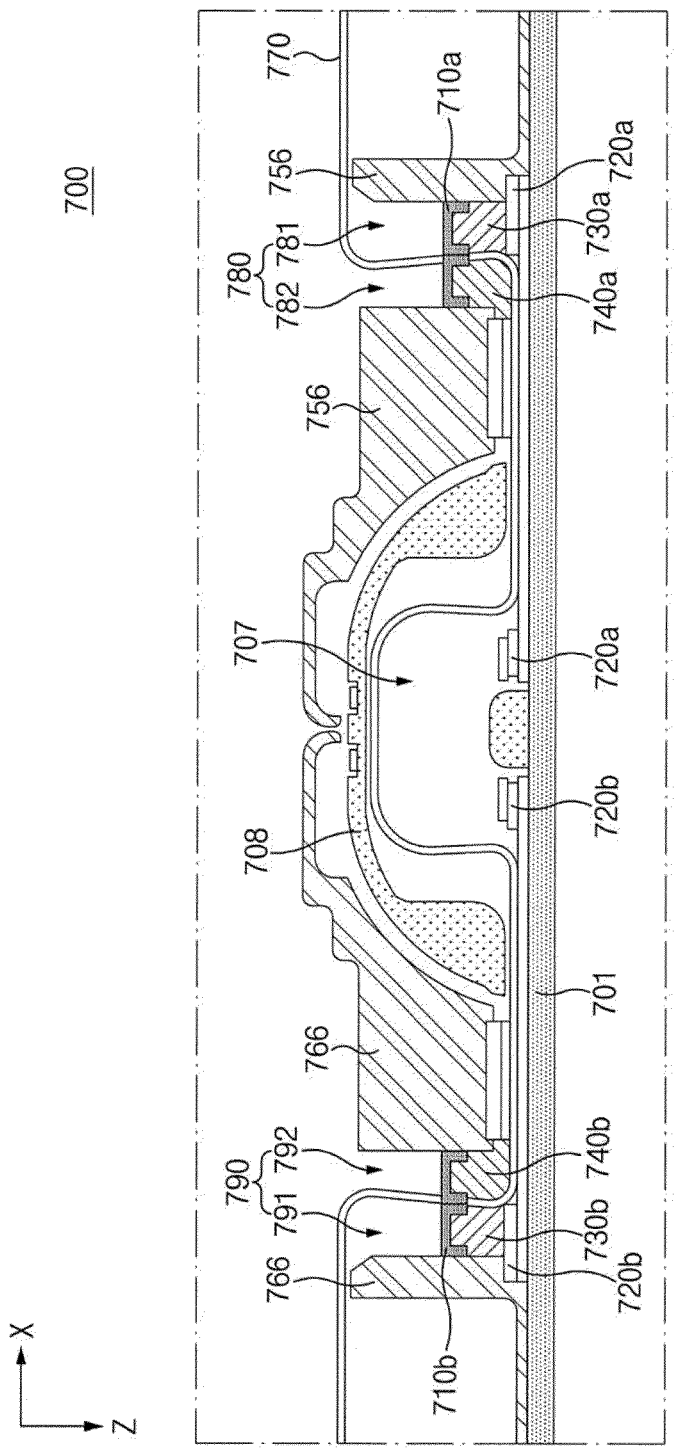

Thereafter, when the first waterproof member 730a and the second waterproof member 740a are assembled, the first sealing member 710a in a liquid form may be applied onto the first waterproof member 730a and the second waterproof member 740a. As the applied first sealing member 710a in the liquid form is cured by light or heat, the solidified first sealing member 710a may be formed as illustrated in FIGS. 7E and 7F.

According to an embodiment, when it is necessary to exchange components due to a waterproof defect or other defects, the first waterproof member 730a and the second waterproof member 740a, which are separate components, and the solidified first sealing member 710a may be easily separated from other components as well as the flexible circuit board 770. Accordingly, the first waterproof member 730a and the second waterproof member 740a, and the solidified first sealing member 710a may be easily removed, and other components including the flexible circuit board 770 may be reassembled without being contaminated.

Figure 8A:
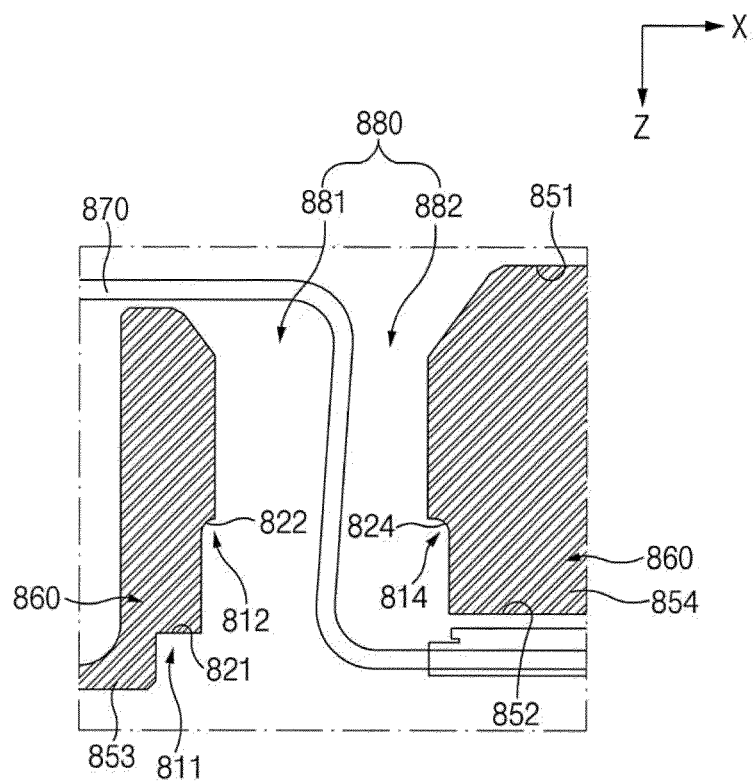
FIGS. 8A to 8C are views illustrating a method for assembling an electronic device including a separation groove according to an embodiment.
Figure 8B:
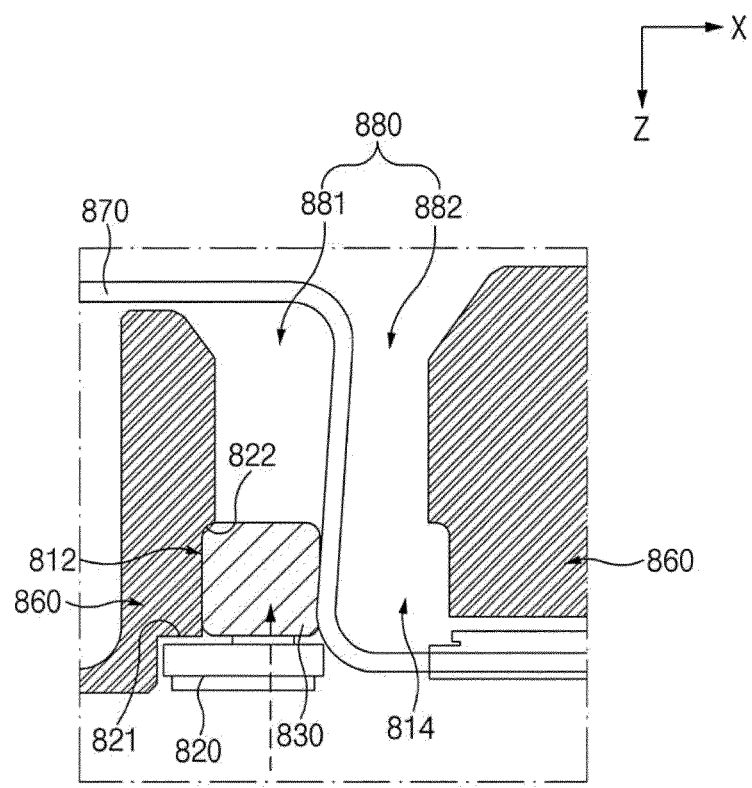
Figure 8C:
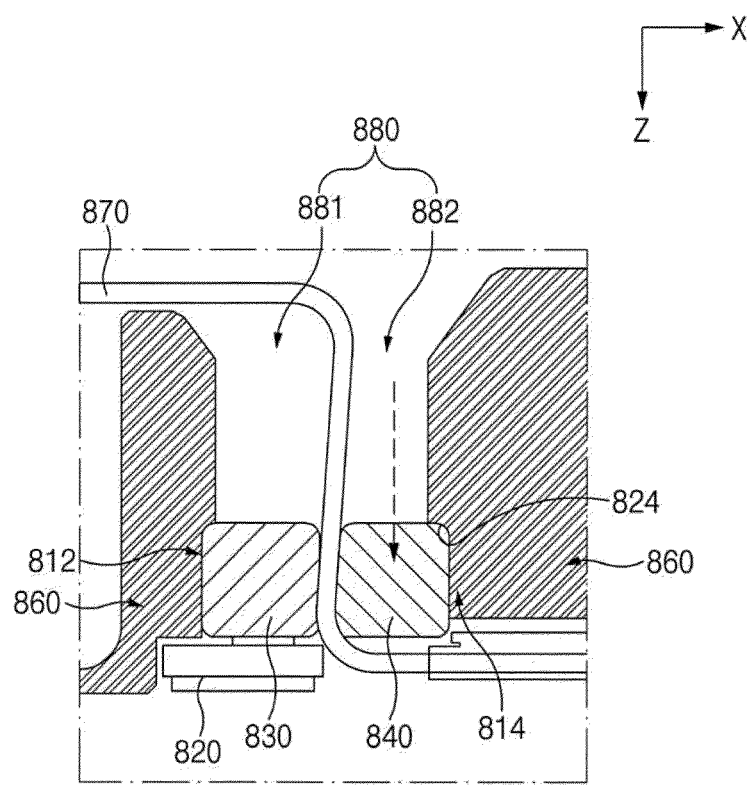

FIGS. 8A to 8C are views illustrating a process of coupling the housing, and the first waterproof member and the second waterproof member according to an embodiment.

As illustrated in FIG. 8A, a first inner seating recess 811 (e.g., the second seating recess 353b of FIGS. 4A and 4B) and a second inner seating recess 812 may be formed on a first side wall 853 of a cover area having a through-hole 880 (e.g., the second through-hole 390 of FIGS. 4A and 4B), where the through-hole 880 passes through a housing 860 (e.g., the second housing 360 of FIGS. 4A and 4B). The first inner seating recess 811 may be formed by removing a partial area between the front surface and the side surface of the housing 860 that face the rear surface of the display to define a first seating surface 821. The first seating surface 821 defined by the first inner seating recess 811 may be implemented as a step in the front surface 853 of the housing, and a second seating surface 822 defined by the second inner seating recess 812 may be implemented as a step in the first seating surface 821.

Due to the first inner seating recess 811 and the second inner seating recess 812, the width of a first opening area 881 (e.g., the third opening area 391 of FIGS. 4A and 4B) may become larger as it goes from the rear surface 851 (e.g., a surface in the −Z direction) toward the front surface 852 (e.g., a surface in the +Z direction) of the housing 860. Here, the front surface 852 of the housing 860 may face the rear surface of the display.

A separation preventing recess 814 implemented in an undercut shape may be formed on a second side wall 854 that faces the first side wall 853. The separation preventing recess 814 may be disposed to face the second inner seating recess 812. A third seating surface 824 defined by the separation preventing recess 814 and the second seating surface 822 defined by the second inner seating recess 812 may be disposed on the same line, i.e., on the same elevation. Because the separation preventing recess 814 may be connected to a second opening area 882 (e.g., the fourth opening area 392 of FIGS. 4A and 4B), the width of the second opening area 882 may become larger as it goes from the rear surface 851 of the housing 860 toward the front surface 852 of the housing 860.

A first waterproof member 830 (e.g., the third waterproof member 330b of FIGS. 4A and 4B) coupled to a support bracket 820 (e.g., the second support bracket 320b of FIGS. 4A and 4B), as illustrated in FIG. 8B, may be inserted into the first opening area 881. The first waterproof member 830 may be inserted into the first opening area 881 to face the first surface (e.g., the surface in the +Z direction) of the flexible circuit board 870. The support bracket 820 may be disposed on the first seating surface 821 defined by the first inner seating recess 811, and the first waterproof member 830 may be disposed on the second seating surface 822 defined by the second inner seating recess 812.

A second waterproof member 840 (e.g., the fourth waterproof member 340b of FIGS. 4A and 4B), as illustrated in FIG. 8C, may be inserted into the second opening area 882. The second waterproof member 840 may be inserted into the second opening area 882 to face the second surface (or the rear surface) (e.g., the surface in the −Z direction) of the flexible circuit board 870. The lower surface of the second waterproof member 840 inserted into the second opening area 882 may be disposed on the third seating surface 824 defined by the separation preventing recess 814. The second waterproof member 840 fixed to the interior of the separation preventing recess 814 may be prevented from deviating in a direction that is opposite to the insertion direction of the second waterproof member 840. Accordingly, because the second waterproof member 840 may help maintain the contact between the flexible circuit board 870 and the first waterproof member 830, waterproofing may be improved.

FIGS. 9A to 9F are views illustrating a process of combining a housing and a waterproof structure according to certain embodiments.

Figure 9A:
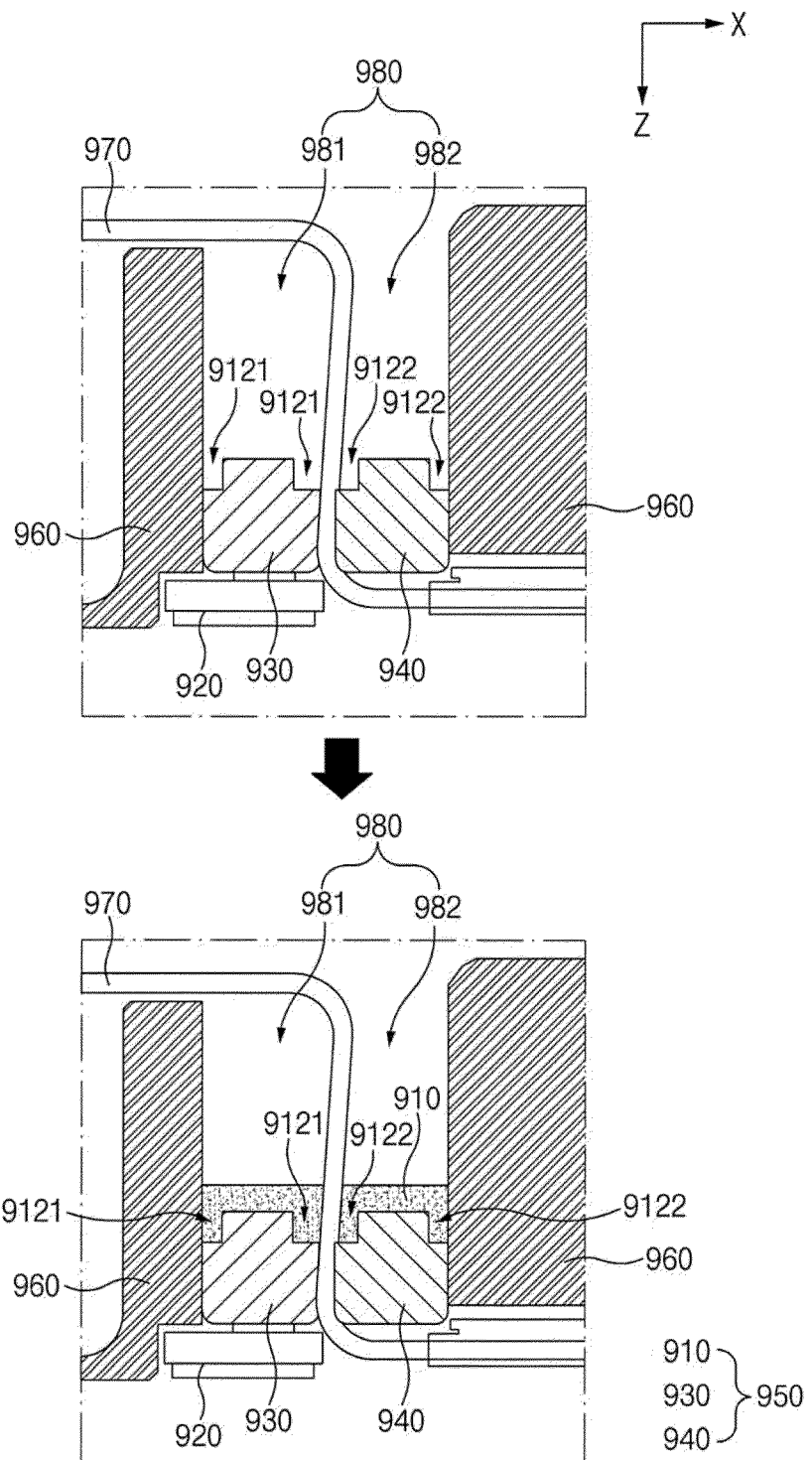
FIGS. 9A to 9F are views illustrating an electronic device including a slot according to certain embodiments.
Figure 9B:
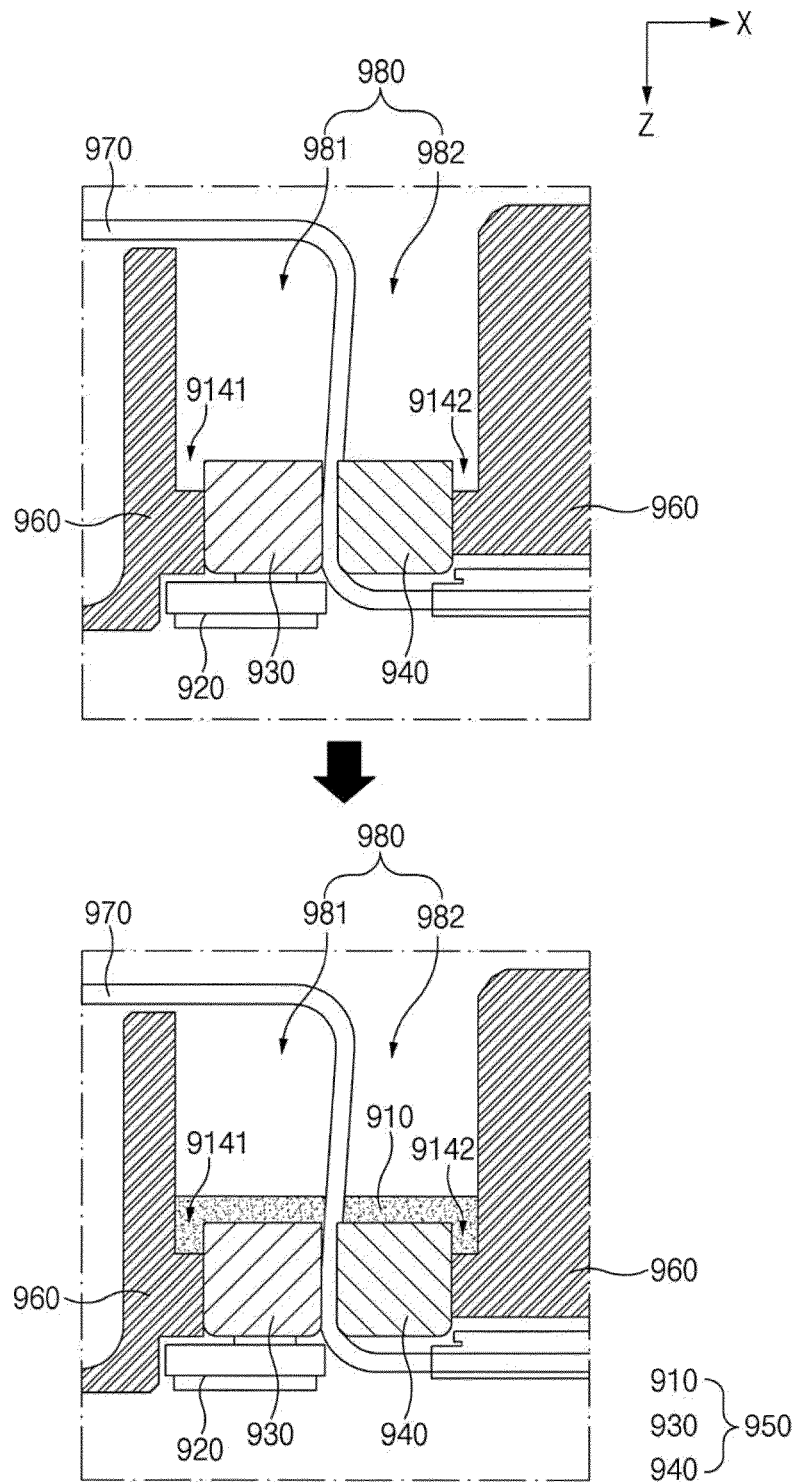
Figure 9C:
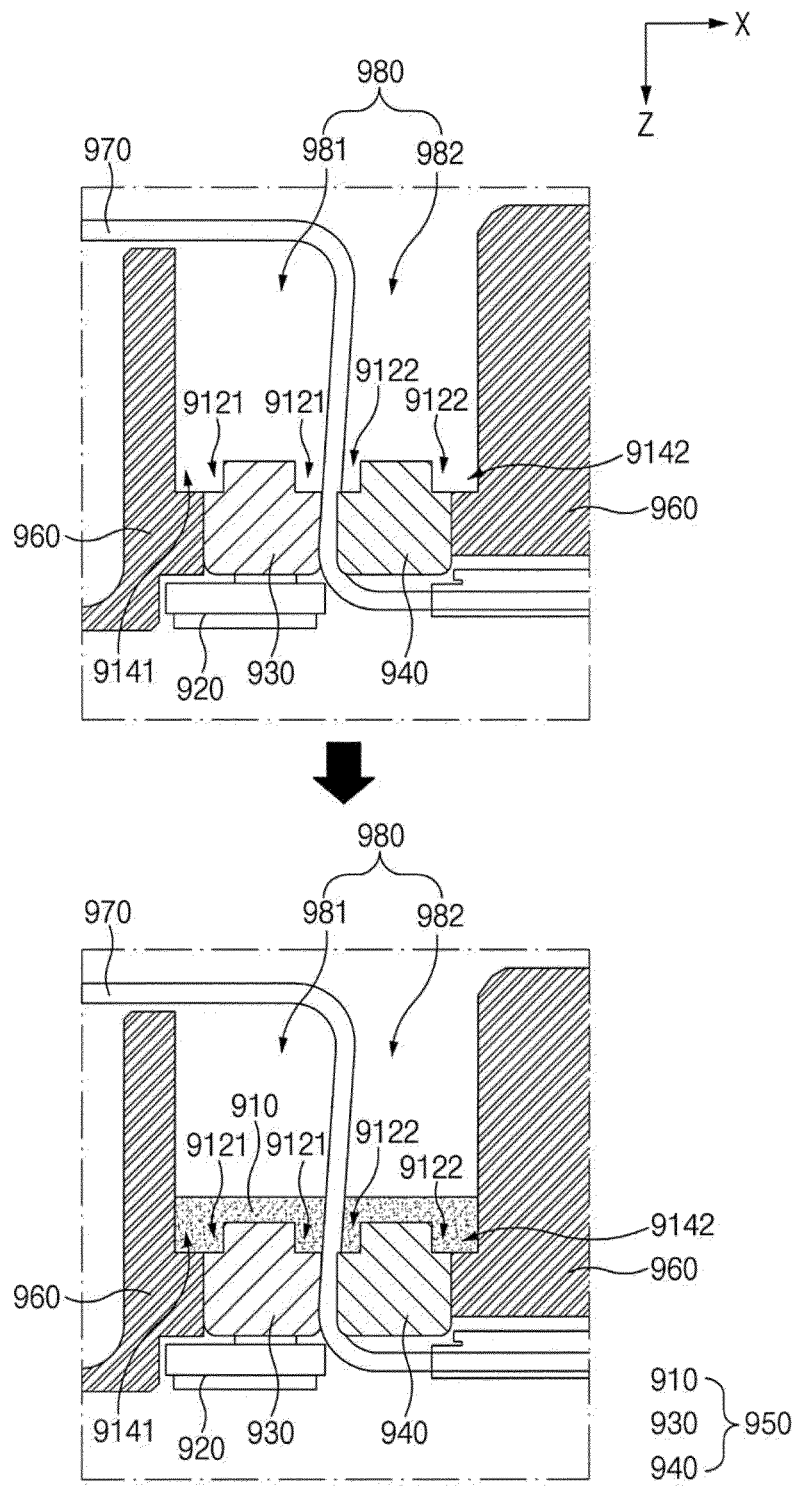
Figure 9D:
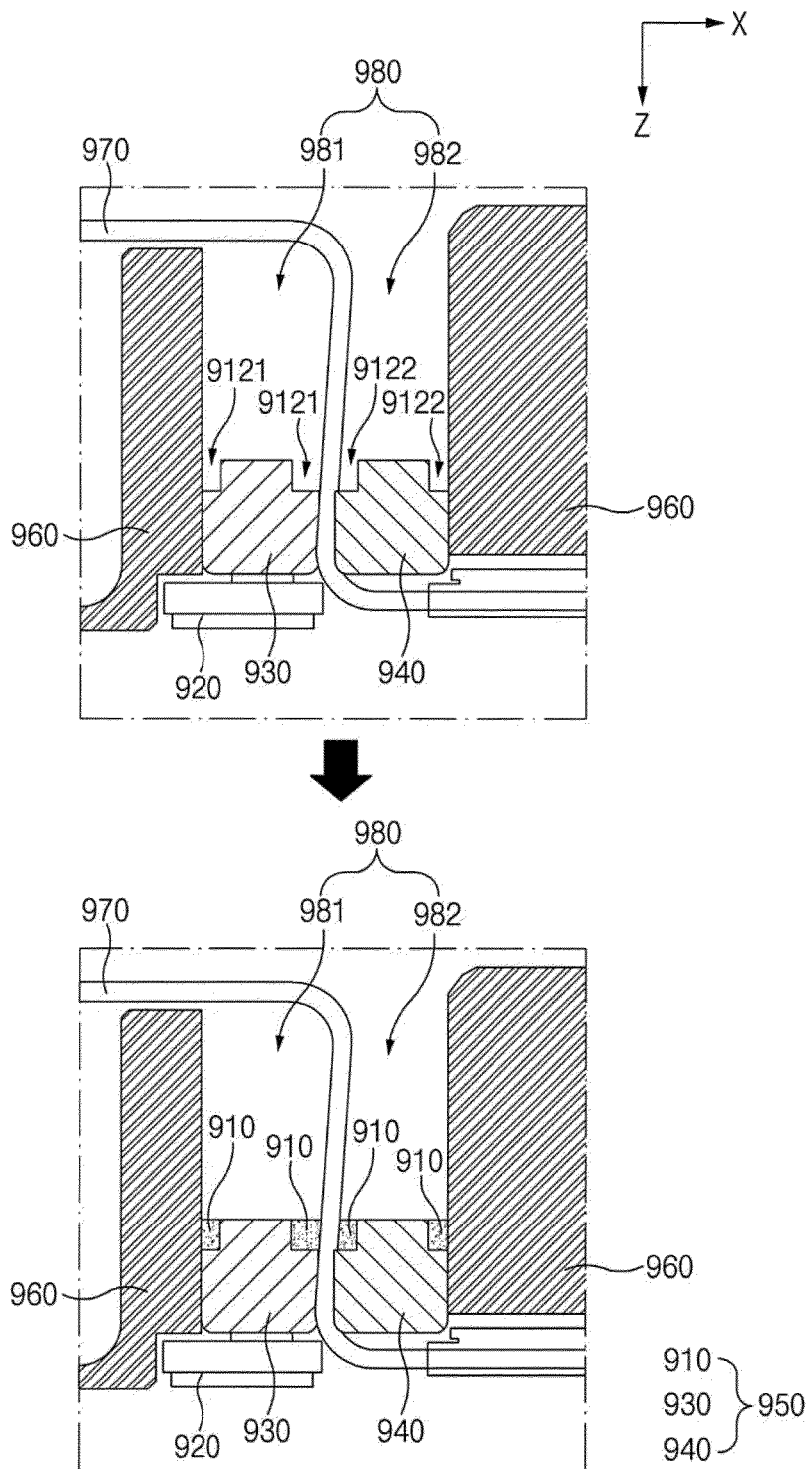
Figure 9E:
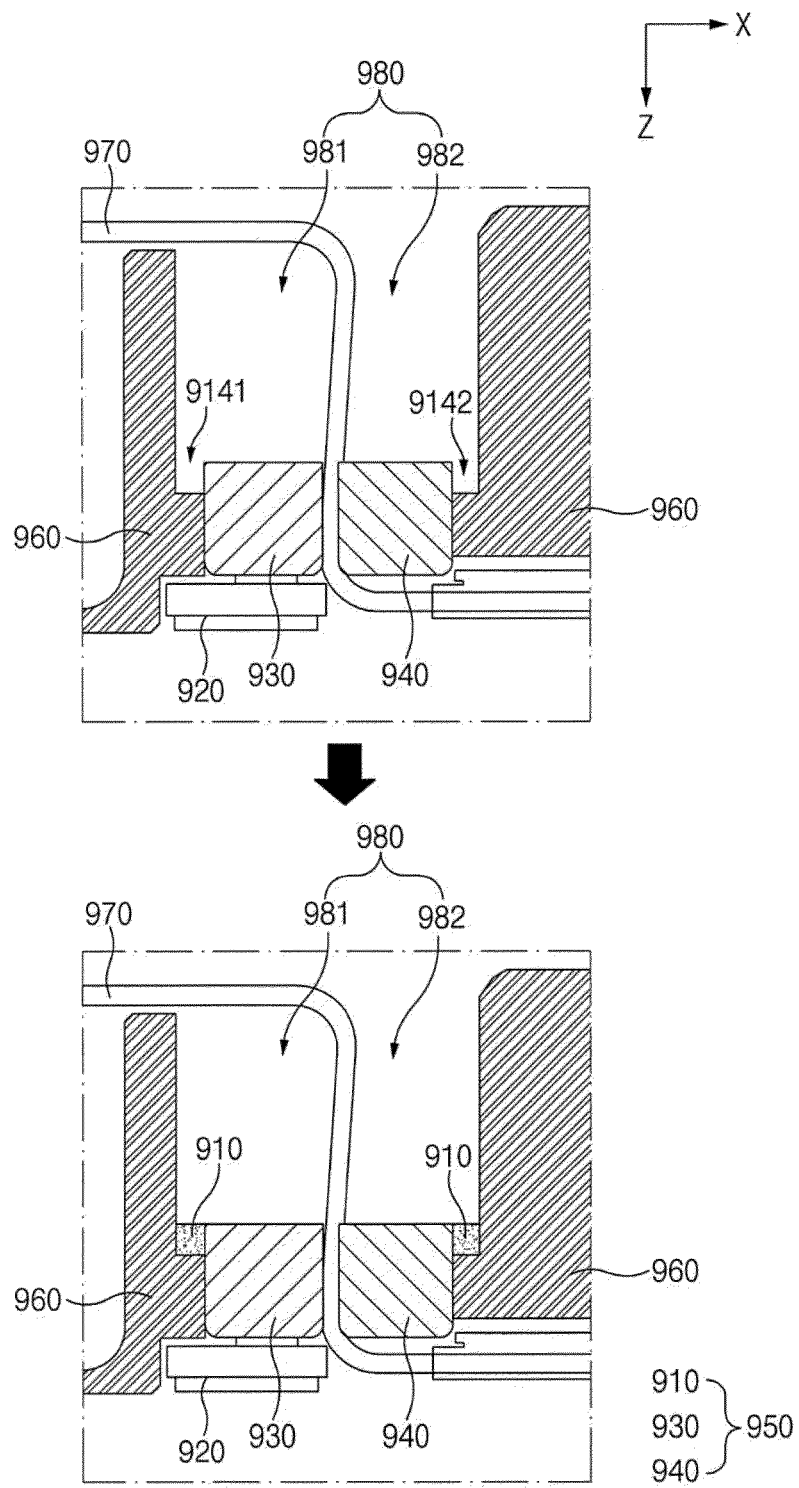
Figure 9F:
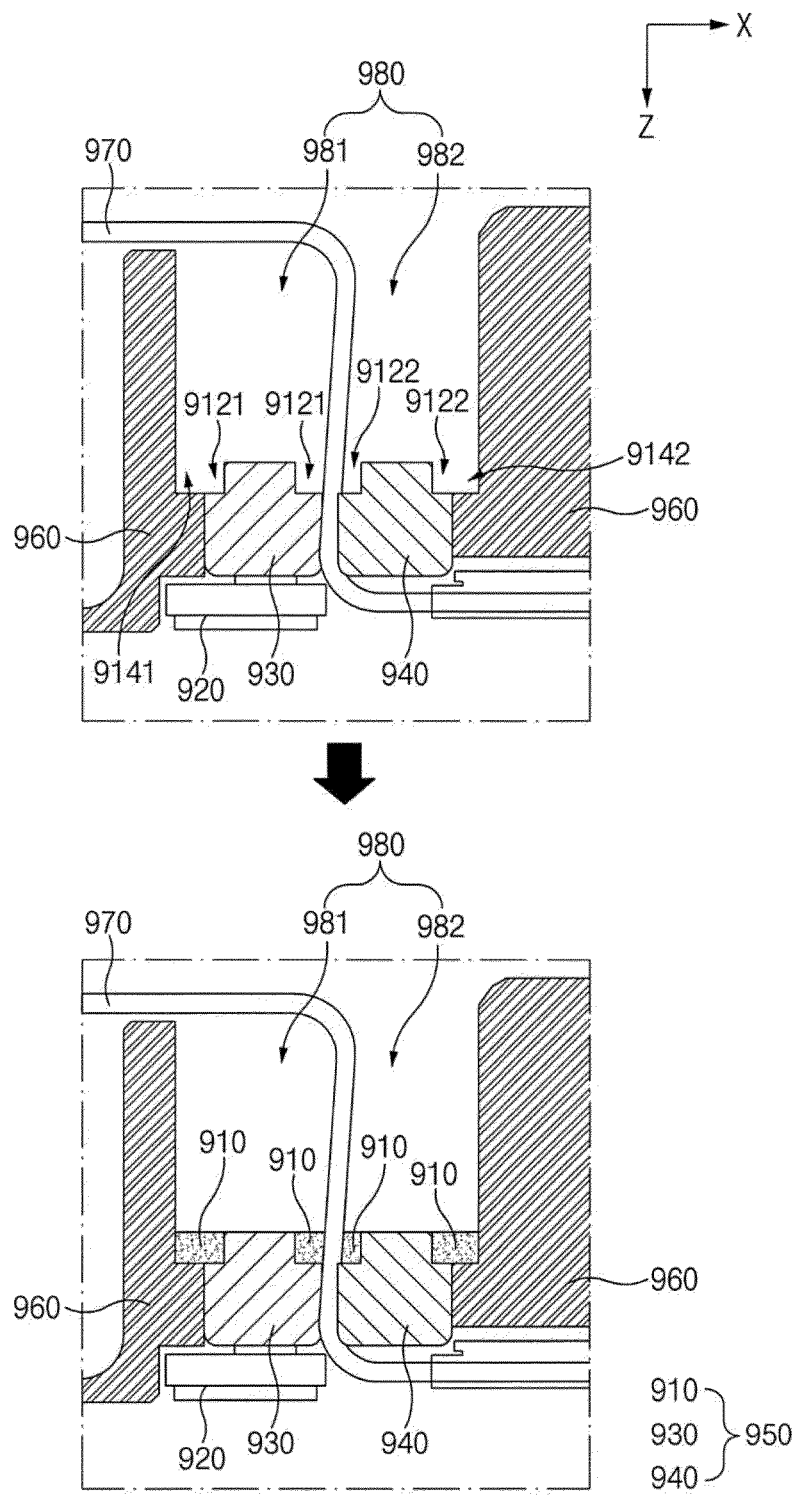

As illustrated in FIGS. 9A to 9F, at least one slot 9121, 9122, 9141, and 9142 may be formed in at least one of a first waterproof member 930 (e.g., the third waterproof member 330b of FIGS. 4A and 4B), a second waterproof member 940 (e.g., the fourth waterproof member 340b of FIGS. 4A and 4B), and a housing 960 (e.g., the second housing 360 of FIGS. 4A and 4B). In an embodiment, as illustrated in FIGS. 9A and 9D, the first slot 9121 may be formed in the first waterproof member 930, and the second slot 9122 may be formed in the second waterproof member 940. In another embodiment, as illustrated in FIGS. 9B and 9E, the third slot 9141 may be formed in the housing 960 that is adjacent to the first waterproof member 930, and the fourth slot 9142 may be formed in the housing 960 that is adjacent to the second waterproof member 940. Furthermore, in another embodiment, as illustrated in FIGS. 9C and 9F, the first slot 9121 may be formed in the first waterproof member 930, the second slot 9122 may be formed in the second waterproof member 940, the third slot 9141 may be formed in the housing 960 that is adjacent to the first waterproof member 930, and the fourth slot 9142 may be formed in the housing 960 that is adjacent to the second waterproof member 940. A person of ordinary skill in the art will easily understand that the number and the shapes of the first slot 9121, the second slot 9122, the third slot 9141, and the fourth slot 9142 are not limited.

The first slots 9121 illustrated in FIGS. 9A, 9C, 9D, and 9F may be formed by removing a portion of one side surface of the first waterproof member 930, which contacts the housing 960, and a portion of an opposite side surface of the first waterproof member 930, which faces a flexible circuit board 970. The first slots 9121 may be disposed between the one side surface of the first waterproof member 930 and the housing 960, and may be disposed between the flexible circuit board 970 and the opposite side surface of the first waterproof member 930. Accordingly, an upper surface (e.g., a surface in the +Z direction) of the first waterproof member 930 that faces a support bracket 920 (e.g., the second support bracket 320b of FIGS. 4A and 4B) may be larger than the lower surface (e.g., a surface in the −Z direction) that faces the rear surface of a housing 960 due to the first slot 9121. The first slots 9121 may be connected to each other through a first opening area 981 (e.g., the third opening area 391 of FIGS. 4A and 4B) and a second opening area 982 (e.g., the fourth opening area 392 of FIGS. 4A and 4B) of a through-hole 980 (e.g., the second through-hole 390 of FIGS. 4A and 4B). According to certain embodiments, the description of the first slots 9121 may be applied to the second slots 9122.

The third slots 9141 illustrated in FIGS. 9B, 9C, 9E, and 9F may be formed by removing a portion of the housing 960, which faces one side surface of the first waterproof member 930. The third slots 9141 may be connected to each other through the first opening area 981 and the second opening area 982. According to certain embodiments, the description of the third slots 9141 may be applied to the fourth slots 9142.

In this way, the first slots 9121, the second slots 9122, the third slots 9141, and the fourth slots 9141 may be connected to each other through the through-hole 980. A sealing member 910 (e.g., the second sealing member 310b of FIGS. 4A and 4B) may be filled on the first waterproof member 930 and the second waterproof member 940 in the through-hole 980 and may be filled in at least one of the first slots 9121, the second slots 9122, the third slots 9141, and the fourth slots 9142 as well. This way, the contact area of the sealing member 910 and the housing 960 may become larger, and contact areas of the sealing member 910, and the first waterproof member 930 and the second waterproof member 940 may become larger. Accordingly, in an embodiment, stable waterproof performance may be provided by using the waterproof structure 950 including the first waterproof member 930, the second waterproof member 940, and the sealing member 910.

According to an embodiment, the sealing member 910 may not be formed on the outermost surfaces of the first waterproof member 930 and the second waterproof member 940, or may not be formed on the first waterproof member 930 and the second waterproof member 940 at all. For example, the sealing member 910 may be filled in the first slot 9121 and the second slot 9122 as illustrated in FIG. 9D, may be filled in the third slot 9141 and the fourth slot 9142 as illustrated in FIG. 9E, and may be filled in the first slot 9121, the second slot 9122, the third slot 9141, and the fourth slot 9142 as illustrated in FIG. 9F.

Figure 10:
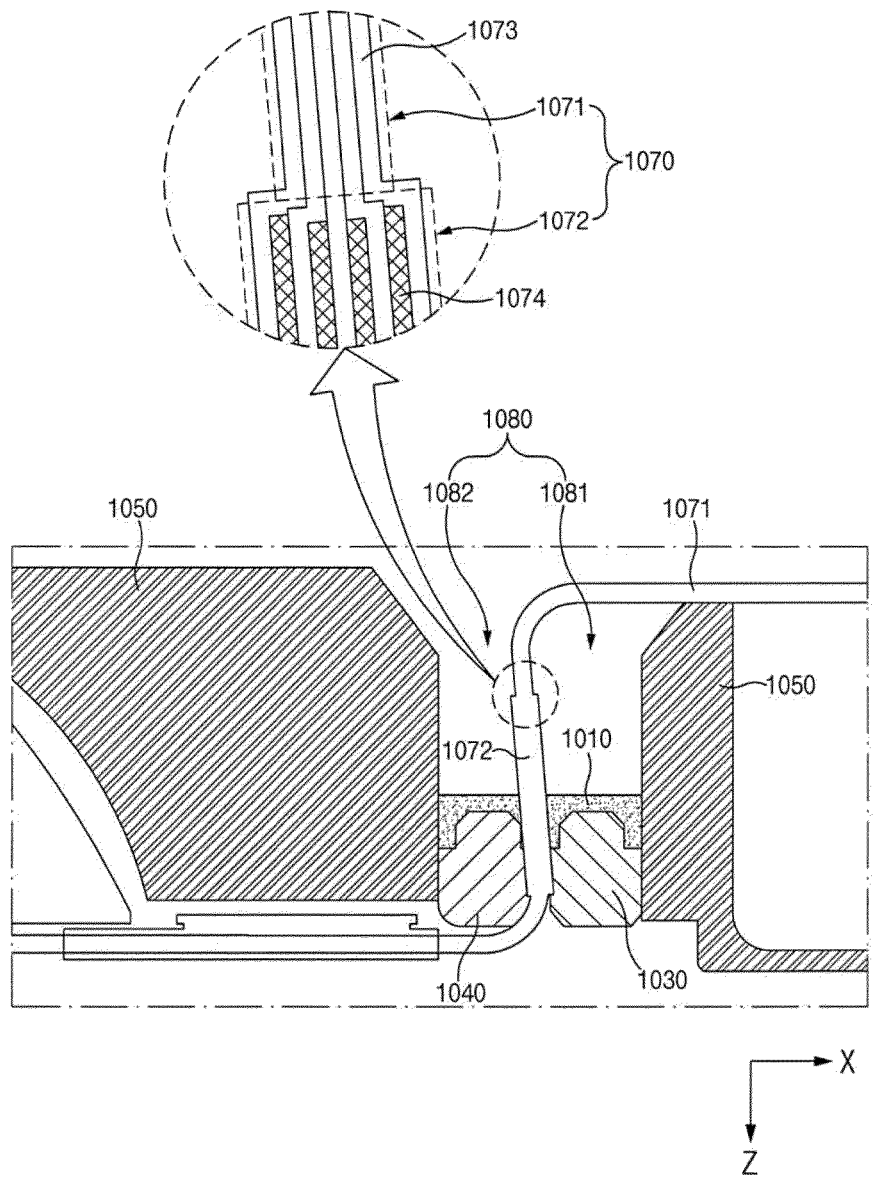
FIG. 10 is a view illustrating a flexible circuit board of an electronic device according to an embodiment in detail.

FIG. 10 is a view illustrating an electronic device including a flexible circuit board according to an embodiment.

Referring to FIG. 10, a flexible circuit board 1070 (e.g., the flexible circuit board 370 of FIGS. 4A and 4B) may include at least one flexible film 1073. When the flexible film 1073 included in the flexible circuit board 1070 is multilayered, bonding layers 1074 may be disposed between the layers of the multilayered flexible film 1073. The bonding layers 1074 may be disposed between the layers of the multilayered flexible film 1073 to couple the adjacent layers of the flexible film 1073. The bonding layers 1074 may be disposed at a portion of the flexible film 1073 to prevent signals transmitted through the flexible circuit board 1070 from being interfered with.

The flexible circuit board 1070 may be divided into a first flexible circuit area 1071 and a second flexible circuit area 1072 according to presence of the bonding layers 1074. The first flexible circuit area 1071 may include the multilayered flexible film 1073 without any bonding layer 1074. The layers of the multilayered flexible film 1073 included in the first flexible circuit area 1071 may be separated from each other. The second flexible circuit area 1072 may include the multilayered flexible film 1073, and bonding layers 1074 disposed between the layers of the multilayered flexible film 1073. The layers of the multilayered flexible film 1073 included in the second flexible circuit area 1072 may be coupled to each other via the bonding layers 1074. The second flexible circuit area 1072 may be thicker than the first flexible circuit area 1071 by the total thickness of the bonding layers 1074. Because the second flexible circuit area 1072 is an area in which the layers of the multilayered flexible film 1073 is bonded to each other via the bonding layers 1074, the flexibility of the second flexible circuit area 1072 may be lower than that of the first flexible circuit area 1071. A deformation characteristic of the second flexible circuit area 1072 may be lower than that of the first flexible circuit area 1071.

The second flexible circuit area 1072 of the flexible circuit board 1070 may 1070 may be held in a through-hole 1080 (e.g., the first through-hole 380 of FIGS. 4A and 4B) including a first opening area 1081 (e.g., the first opening area 381 of FIGS. 4A and 4B) and a second opening area 1082 (e.g., the second opening area 382 of FIGS. 4A and 4B). The through-hole 1080 may pass through a housing 1050 (e.g., the first housing 350 of FIGS. 4A and 4B). The second flexible circuit area 1072 may be disposed to overlap a sealing member 1010 (e.g., the first sealing member 310a of FIGS. 4A and 4B). Because the sealing member 1010 may not perfectly seal the layers of the multilayered flexible film 1073 included in the first flexible circuit area 1071 that are separated, spaces between the layers of the multilayered flexible film 1073 included in the first flexible circuit area 1071 may become fluid flow paths.

Accordingly, the sealing member 1010 may be applied between a first waterproof member 1030 (e.g., the first waterproof member 330a of FIGS. 4A and 4B) and a second waterproof member 1040 (e.g., the second waterproof member 340a of FIGS. 4A and 4B), and the second flexible circuit area 1072. Because the layers of the multilayered flexible film 1073 included in the second flexible circuit area 1072 are coupled to each other via the bonding layers 1074, external fluids may be prevented from being introduced between the layers of the multilayered flexible film 1073 included in the second flexible circuit area 1072. That is, the bonding layers 1074 may effectively block the flow of fluids.

Figure 11A:
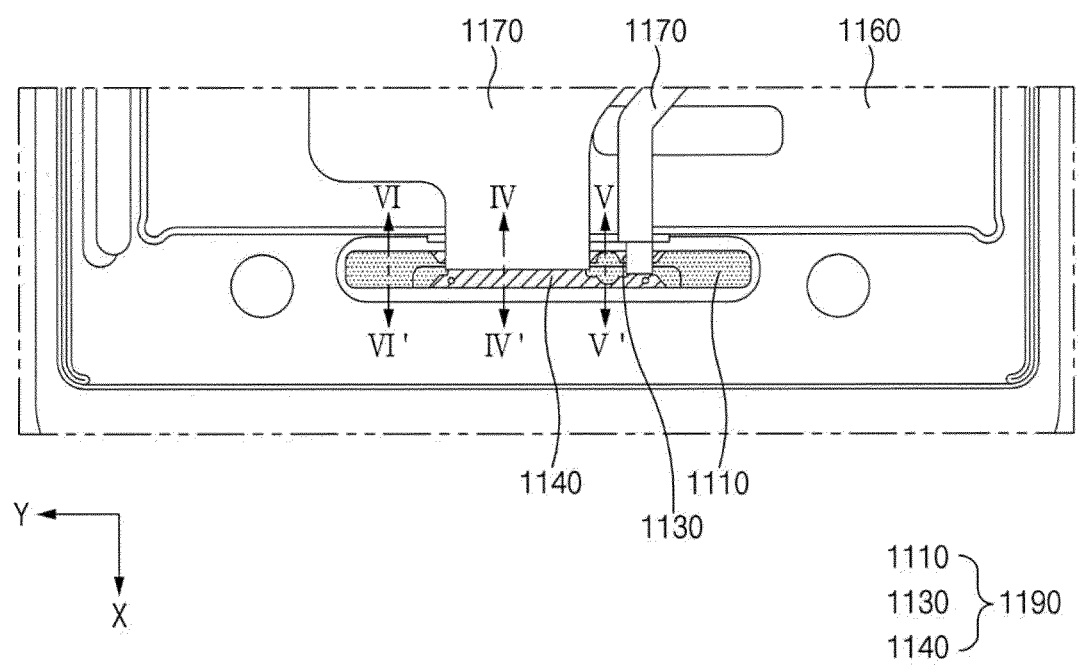
FIGS. 11A to 11D are views illustrating a waterproof structure of a foldable electronic device according to various embodiments.
Figure 11B:
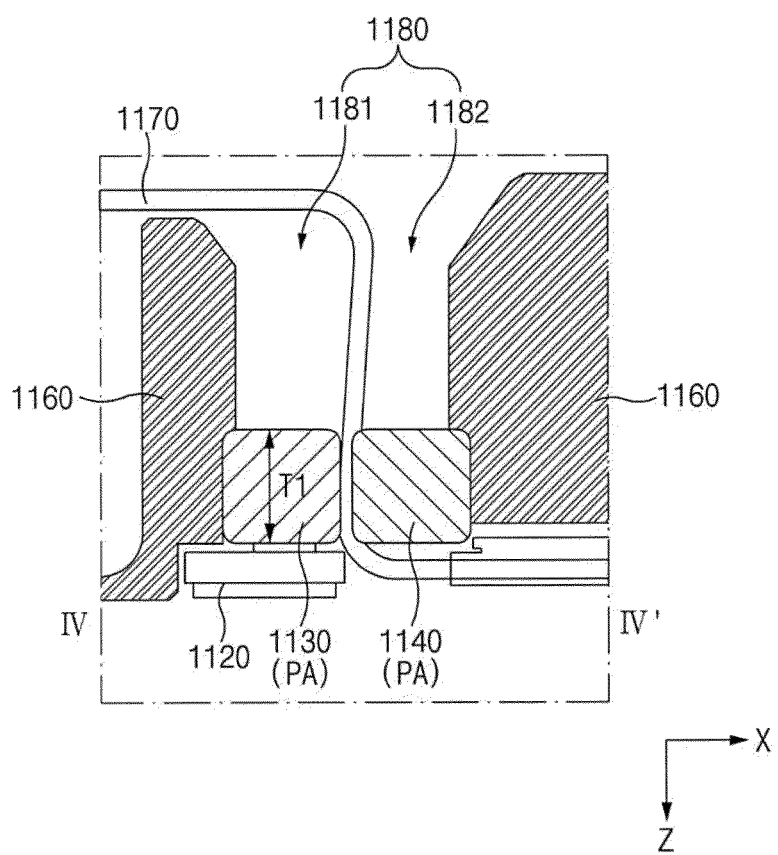
Figure 11C:
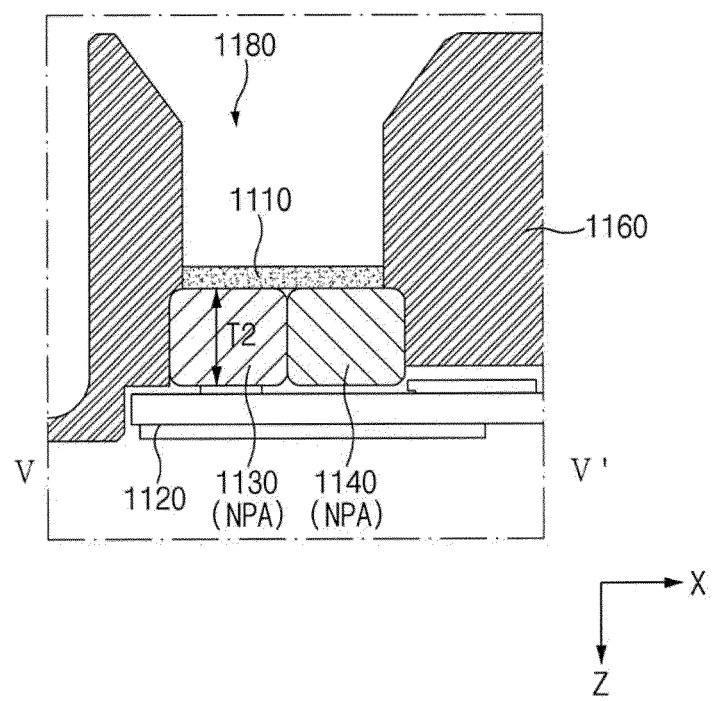
Figure 11D:
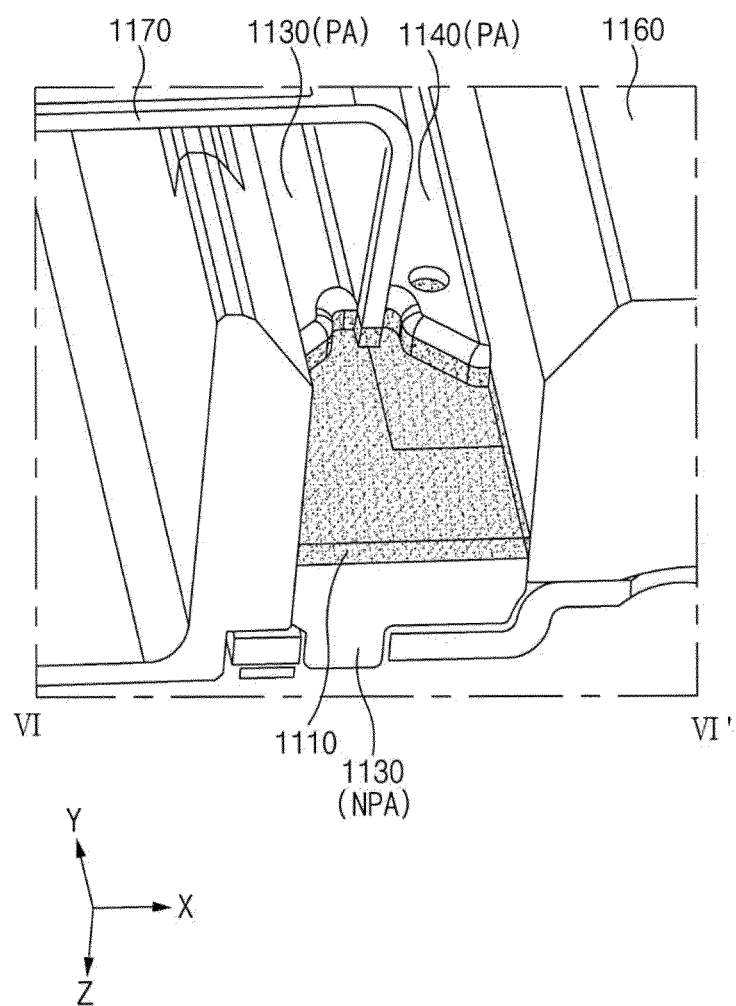

FIG. 11A is a view illustrating a waterproof structure 1190 of an electronic device according to an embodiment. FIG. 11B is a view illustrating an electronic device, taken along line IV-IV'. FIG. 11C is a view illustrating an electronic device, taken along line V-V'. FIG. 11D is a view illustrating an electronic device, taken along line VI-VI'.

Referring to FIGS. 11A to 11D, in each of the first waterproof member 1130 and the second waterproof member 1140, the thickness of an area corresponding to the flexible circuit board 1170 may be different from the thickness of an area that does not correspond to the flexible circuit board 1170. For example, in each of the first waterproof member 1130 (e.g., the third waterproof member 330b of FIGS. 4A and 4B) and the second waterproof member 1140 (e.g., the fourth waterproof member 340b of FIGS. 4A and 4B), a thickness T1 of an area corresponding to the flexible circuit board 1170 may be larger than a thickness T2 of an area that does not correspond to the flexible circuit board 1170. Accordingly, area of the first waterproof member 1130 and the second waterproof member 1140, which correspond to the flexible circuit board 1170, may protrude further than the other areas. Each of the first waterproof member 1130 and the second waterproof member 1140 may include a protrusion area PA corresponding to the flexible circuit board 1170, and a non-protrusion area NPA that does not correspond to the flexible circuit board 1170.

The protrusion area PA of at least one of the first waterproof member 1130 and the second waterproof member 1140 may be applied to a through-hole 1180 (e.g., the second through-hole 390 of FIGS. 4A and 4B) including a first opening area 1181 (e.g., the third opening area 391 of FIGS. 4A and 4B) and a second opening area 1182 (e.g., the fourth opening area 392 of FIGS. 4A and 4B) to implement a dam when a sealing member 1110 is applied. The through-hole 1180 may pass through a housing 1160 (e.g., the second housing 360 of FIGS. 4A and 4B). The sealing member 1110 (e.g., the second sealing member 310b of FIGS. 4A and 4B) may be applied onto the non-protrusion areas NPA of the first waterproof member 1130 and the second waterproof member 1140, other than to the areas corresponding to the flexible circuit board 1170. The sealing member 1110 may not be diffused to the protrusion areas PA of the first waterproof member 1130 and the second waterproof member 1140, and thus may not be disposed on the protrusion areas PA. Accordingly, the sealing member 1110 may be disposed on the first waterproof member 1130 and the second waterproof member 1140, which face each other, in an area without any flexible circuit board 1170. Conversely, the sealing member 1110 may not be disposed on the first waterproof member 1130 and the second waterproof member 1140, which face each other, while the flexible circuit board 1170 being interposed therebetween. Opposite side surfaces of the flexible circuit board 1170 may extend in the second direction (the +Y direction band the −Y direction) further than the opposite side surfaces of the first and second waterproof members 1130 and 1140. In this case, the sealing member 1110 may be disposed around the opposite side surfaces of the flexible circuit board 1170. The sealing member 1110 may be applied to a border area (or an interface) of the first waterproof member 1130 and the second waterproof member 1140, and contact point areas with the opposite side surfaces of the flexible circuit board 1170. Furthermore, the sealing member 1110 may be applied to a border area of the first waterproof member 1130 and the second waterproof member 1140, and a contact point area of the housing 1160. For example, the sealing member 1110 may seal a border area (a first area) between the first waterproof member 1130 and the second waterproof member 1140, which face each other without any flexible circuit board 1170, contact point areas (a second area) of the border area of the first waterproof member 1130 and the second waterproof member 1140 and the opposite side surfaces of the flexible circuit board 1170, and a contact point area (a third area) of the border area of the first waterproof member 1130 and the second waterproof member 1140, and the housing 1160.

In this way, the sealing member 1110 may not be applied onto the protrusion area PA of each of the first waterproof member 1130 and the second waterproof member 1140, but the sealing member 1110 may be applied onto the non-protrusion areas NPA. Accordingly, because no portions of the sealing member 1110 are obscured by the flexible circuit board 1170 that overlaps the protrusion areas PA, and a situation where the sealing member 1110 is not properly cured because a portion of the sealing member 1110 is blocked from the curing agent by the flexible circuit board 1170 can be prevented. Furthermore, when the liquid sealing member 1110 is applied, the sealing member 1110 may be prevented from overflowing to an area outside the through-hole 1180, or being not filled in the through-hole 1180 due to the shape of the flexible circuit board 1170.

According to an embodiment, the sealing member 1110 may be applied along spaces between the non-protrusion areas NPA of the first waterproof member 1130 and the second waterproof member 1140 by using a dispenser. During the dispensing process, the sealing member 1110 may be applied to neither of the spaces between the protrusion areas PA of the first waterproof member 1130 nor the second waterproof member 1140. Accordingly, the processing time for the sealing member 1110 may be reduced when the sealing member 1110 is applied along the spaces between the non-protrusion areas NPA of the first waterproof member 1130 and the second waterproof member 1140 rather than when the sealing member 1110 is applied to the entire through-hole 1180.

According to an embodiment, the sealing member 1110 may be applied along the spaces between the non-protrusion areas NPA of the first waterproof member 1130 and the second waterproof member 1140, which face each other, in an area without any flexible circuit board 1170. The sealing member 1110 may seal an aperture that may be formed along the spaces between the non-protrusion areas NPA of the first waterproof member 1130 and the second waterproof member 1140, which face each other, in an area without any flexible circuit board 1170.

The sealing member 1110 may be applied to an interface of the first waterproof member 1130 and the second waterproof member 1140, and a contact point area with a side surface of the flexible circuit board 1170. The sealing member 1110 may be filled in an aperture that may be formed on an interface of the first waterproof member 1130 and the second waterproof member 1140, and in a contact point area with a side surface of the flexible circuit board 1170 to seal the aperture.

Figure 12A:
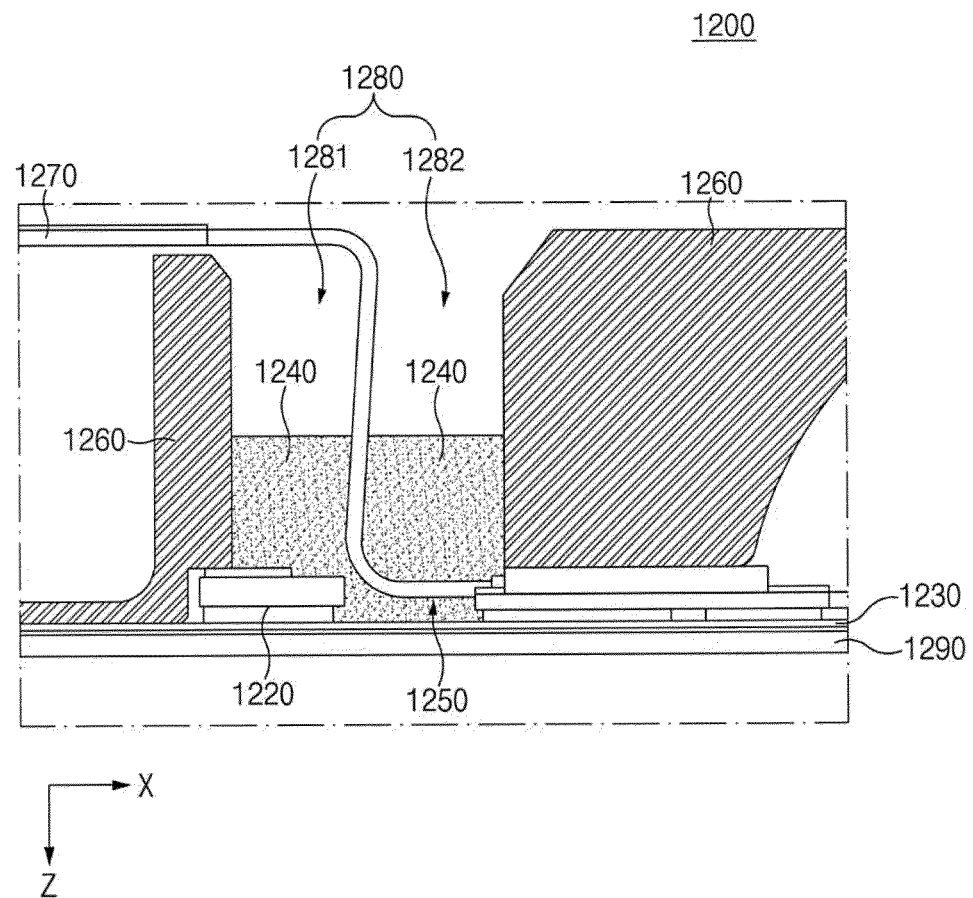
FIGS. 12A and 12B are cross-sectional views illustrating a foldable electronic device according to various embodiments.
Figure 12B:
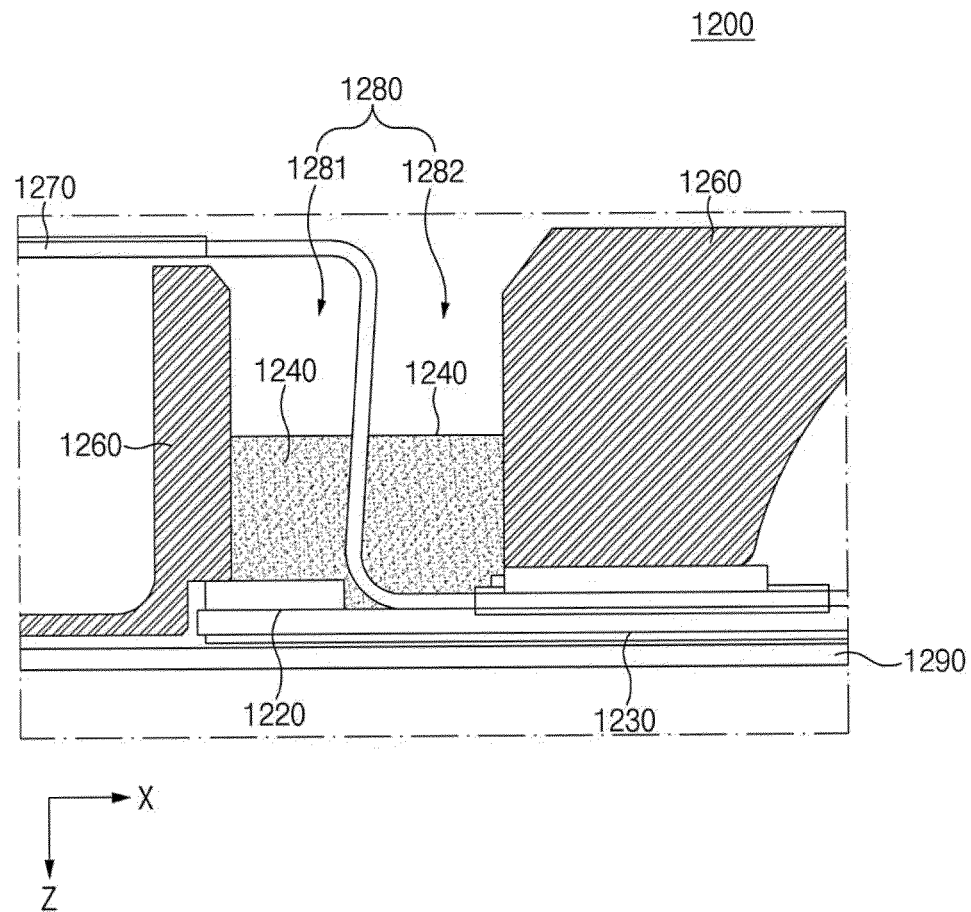
Figure 13:
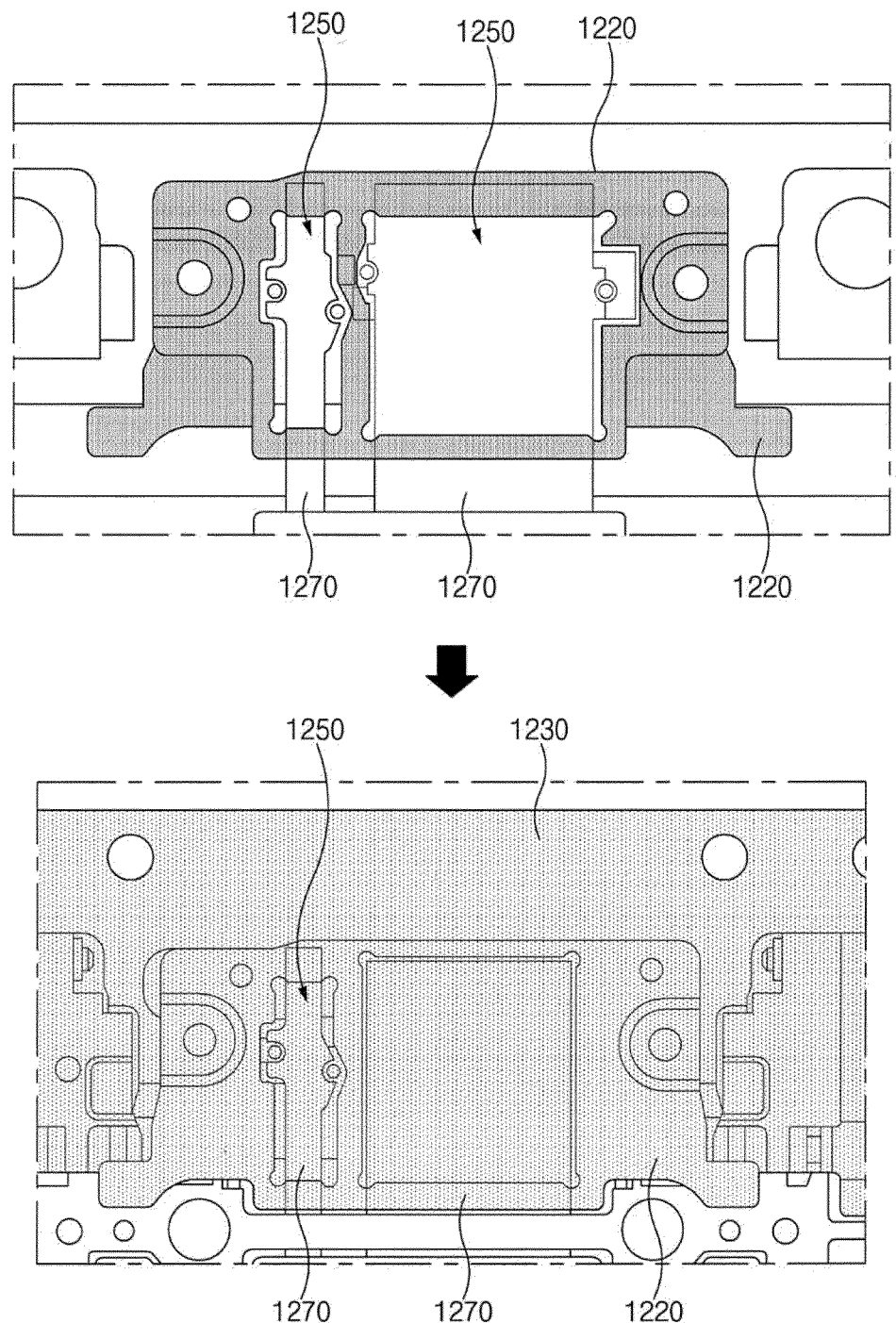
FIG. 13 is a view illustrating a method for assembling a foldable electronic device according to various embodiments.

The sealing member 1110 may not be applied between the protrusion areas PA of the first waterproof member 1130 and the second waterproof member 1140, which face each other, with the flexible circuit board 1170 being interposed therebetween. The protrusion areas PA of the first waterproof member 330*a* and the second waterproof member 340*a* may be attached to each other while the flexible circuit board 1170 being interposed therebetween. The flexible circuit board 1170 may fill the apertures that may be formed between the protrusion areas PA of the first waterproof member 330*a* and the second waterproof member 340*a*. FIGS. 12A and 12B are cross-sectional views illustrating a foldable electronic device according to certain embodiments. FIG. 13 is a view illustrating a method for assembling an electronic device according to an embodiment.

Referring to FIGS. 12A to 13, a foldable electronic device 1200 according to an embodiment may include a cover area 1260 (e.g., the second housing 360 of FIGS. 4A and 4B, the second cover area 366), and a flexible circuit board 1270 (e.g., the flexible circuit board 370 of FIGS. 4A and 4B), a waterproof member 1240, a support bracket 1220 (e.g., the second support bracket 320*b* of FIGS. 4A and 4B) including a bracket hole 1250, and a blocking structure 1230.

The cover area 1260 may include a through-hole 1280 that passes through the front surface of the housing from the rear surface of the housing. The through-hole 1280 (e.g., the second through-hole 390 of FIGS. 4A and 4B) may include a first opening area 1281 (e.g., the third opening area 391 of FIGS. 4A and 4B) and a second opening area 1282 (e.g., the fourth opening area 392 of FIGS. 4A and 4B). The flexible circuit board 1270 may be disposed to pass via the front surface of the cover area 1260 from the rear surface of the cover area 1260 through the through-hole 1280. Because the support bracket 1220 is formed to cover the through-hole 1280 between a display 1290 and the cover area 1260, it may support the flexible circuit board 1270.

The waterproof member 1240 may prevent fluids from penetrating between the flexible circuit board 1270 disposed in the through-hole 1280 and the cover area 1260. The waterproof member 1240 may be inserted into (or filled in) the through-hole 1280 including the first opening area 1281 and the second opening area 1282. The waterproof member 1240 may be inserted into (or filled in) the first opening area 1281 disposed between the cover area 1260 and one surface of the flexible circuit board 1270. The waterproof member 1240 may be inserted into (or filled in) the second opening area 1282 disposed between the cover area 1260 and a second surface (or the rear surface) of the flexible circuit board 1270. The waterproof member 1240 may be formed by solidifying a material that is initially a liquid. For example, the waterproof member 1240 may be formed by applying a cured in-place gasket (CIPG) that is initially a liquid to the through-hole 1280 and curing and solidifying it by using light or heat.

The blocking structure 1230 may limit an application area of the waterproof member 1240 when it is a liquid having fluidity during the application process of the waterproof member 1240. The blocking structure 1230 may be tape, a screw, or a hook, etc. to block a surface that is opposite to the surface on which the waterproof member 1240 is applied. The blocking structure 1230 as tape may be a thin film illustrated in FIG. 12A or a thick film illustrated in FIG. 12B. Accordingly, the blocking structure 1230 may prevent the waterproof member 1240 from being applied to an area outside the through-hole 1280.

According to an embodiment, the blocking structure 1230 may be formed by disposing the support bracket 1220 on the front surface of the cover area 1260 of the housing and disposing it to cover the support bracket 1220.

According to an embodiment, the electronic device 300 may include the first housing 350 including the first through-hole 380, the second housing 360 including the second through-hole 390, the at least one flexible circuit board 370 passing via the first through-hole 380 and the second through-hole 390, the first support bracket 320*a* disposed between the flexible circuit board 370 and the display 301 to support the flexible circuit board 370 while covering the first through-hole 380, the second support bracket 320*b* disposed between the flexible circuit board 370 and the display 301 to support the flexible circuit board 370 while covering the second through-hole 390, the first waterproof member 330*a* disposed to face a partial area of the first through-hole 380 from the first support bracket 320*a* and inserted into the partial area of the first through-hole 380, the second waterproof member 340*a* facing the first waterproof member 330*a* while the flexible circuit board 370 is interposed therebetween, and inserted into the remaining areas 382 of the first through-hole 380, the third waterproof member 330*b* disposed to face a partial area of the second through-hole 390 from the second support bracket 320*b* and inserted into the partial area of the second through-hole, the fourth waterproof member 340*b* facing the third waterproof member 330*b* while the flexible circuit board is interposed therebetween, and inserted into the remaining areas of the second through-hole 390, the first sealing member 310*a* disposed on the first waterproof member 330*a* and the second waterproof member 340*a*, and the second sealing member 310*b* disposed on the third waterproof member 330*b* and the fourth waterproof member 340*b*.

According to an embodiment, the first waterproof member 530 may be integrally formed with the first support bracket 520 or may be assembled in the first support bracket 520, and the third waterproof member may be integrally formed with the second support bracket or may be assembled in the second support bracket.

According to an embodiment, portions of the first waterproof member 1130 and the second waterproof member 1140 may face each other with the flexible circuit board 1170 being interposed therebetween, the remaining portions of the first waterproof member 1130 and the second waterproof member 1140 may face each other while the at least one flexible circuit board is absent in the remaining portions of the first waterproof member and the second waterproof member, portions of the third waterproof member and the fourth waterproof member may face each other with the flexible circuit board being interposed therebetween, and the remaining portions of the third waterproof member and the fourth waterproof member may face each other while the at least one flexible circuit board is absent in the remaining portions of the third waterproof member and the fourth waterproof member.

According to an embodiment, thicknesses T1 of the portions of the first waterproof member 1130 and the second waterproof member 1140 may be larger than thicknesses T2 of the remaining portions of the first waterproof member and the second waterproof member, and thicknesses of the portions of the third waterproof member and the fourth waterproof member may be larger than thicknesses of the remaining portions of the third waterproof member and the fourth waterproof member.

According to an embodiment, the first sealing member 1110 may be disposed on the remaining portions of the first waterproof member 1130 and the second waterproof member 1140, and the second sealing member may be disposed on the remaining portions of the third waterproof member and the fourth waterproof member.

According to an embodiment, the first sealing member 1110 may be disposed on a contact point area between an interface of the first waterproof member 1130 and the second waterproof member 1140, and a side surface of the flexible circuit board 1170, the first sealing member 1110 may be disposed on a contact point area between the interface of the first waterproof member 1130 and the second waterproof member 1140, and the first housing 1160, the second sealing member may be disposed on a contact point area between an interface of the third waterproof member and the fourth waterproof member, and a side surface of the flexible circuit board, and the second sealing member may be disposed on a contact point area between the interface of the third waterproof member and the fourth waterproof member, and the second housing.

According to an embodiment, in a viewing direction of the display, each of the first waterproof member 730*a* and the third waterproof member 730*b* may be in a "U" shape to cover a partial area of the at least one flexible circuit board 770, a portion of the second waterproof member 740*a* may be disposed in the "U" shape of the first waterproof member 730*a* to be covered by the at least one flexible circuit board 770, and a portion of the fourth waterproof member 740*b* may be disposed in the "U" shape of the third waterproof member 730*b* to be covered by the at least one flexible circuit board 770.

According to an embodiment, an area of the second waterproof member may be smaller than an area of the first waterproof member, and an area of the fourth waterproof member may be smaller than an area of the third waterproof member.

According to an embodiment, the electronic device may further include a hinge housing disposed between the first housing and the second housing, and at least any one of the first support bracket and the second support bracket may overlap a hinge groove in the hinge housing.

According to an embodiment, any one of the first waterproof member and the third waterproof member may include a plurality of first bosses, and first insertion grooves at least one of which is disposed between the plurality of first bosses, and any one of the second waterproof member and the fourth waterproof member may include a plurality of second bosses facing the first bosses, and second insertion grooves facing the first insertion grooves and at least one of which is disposed between the second bosses, and the flexible circuit board may be disposed in the first and second insertion grooves.

According to an embodiment, the first through-hole may include a first opening area, in which the first waterproof member is inserted, and a second opening area, in which the second waterproof member is inserted, the second through-hole may include a third opening area, in which the third waterproof member is inserted, and a fourth opening area, in which the fourth waterproof member is inserted, the first waterproof member may be disposed between the first support bracket and the flexible circuit board, the third waterproof member may be disposed between the second support bracket and the flexible circuit board, and the flexible circuit board may be disposed between the second waterproof member and the first support bracket, and between the fourth waterproof member and the second support bracket.

According to an embodiment, the electronic device may further include a separation preventing recess disposed in at least any one of the second opening area and the fourth opening area and open to the at least any one of the second opening area and the fourth opening area, and at least any one of the second waterproof member and the fourth waterproof member may be inserted into the separation preventing recess.

According to an embodiment, the electronic device may further include at least one slot, into which the first sealing member and/or the second sealing member is inserted, and the at least one slot may be disposed in at least any one of the first waterproof member, the second waterproof member, the third waterproof member, the fourth waterproof member, the first housing, and the second housing, and is open to at least any one of the first through-hole and the second through-hole.

According to an embodiment, the flexible circuit board may include a first flexible area and a second flexible area of different thicknesses, and a thicker one of the first flexible area and the second flexible area may be disposed between the first waterproof member and the second waterproof member, and disposed between the third waterproof member and the fourth waterproof member.

According to an embodiment, the flexible circuit board may include a plurality of flexible films with bonding layers being interposed therebetween, and the bonding layers may be disposed between the first waterproof member and the second waterproof member, and between the third waterproof member and the fourth waterproof member.

According to an embodiment, an electronic device includes a first housing including a first through-hole, a second housing including a second through-hole, at least one flexible circuit board passing via the first through-hole and the second through-hole, a first waterproof member inserted into a partial area of the first through-hole, a second waterproof member inserted into the remaining areas of the first through-hole, a third waterproof member inserted into a partial area of the second through-hole, a fourth waterproof member inserted into the remaining areas of the second through-hole, a first sealing member disposed on the first waterproof member and the second waterproof member, a second sealing member disposed on the third waterproof member and the fourth waterproof member, portions of the first waterproof member and the second waterproof member face each other with the at least one flexible circuit board being interposed therebetween, portions of the third waterproof member and the fourth waterproof member face each other with the at least one flexible circuit board being interposed therebetween, wherein the first sealing member is disposed on the remaining portions of the first waterproof member and the second waterproof member, which face each other while the at least one flexible circuit board is absent in the remaining portions of the first waterproof member and the second waterproof member, and wherein the second sealing member is disposed on the remaining portions of the third waterproof member and the fourth waterproof member, which face each other while the at least one flexible circuit board is absent in the remaining portions of the third waterproof member and the fourth waterproof member.

According to an embodiment, in a viewing direction of front surfaces of the first housing and the second housing, each of the first waterproof member and the third waterproof member may be in a "U" shape to cover a partial area of the at least one flexible circuit board, a portion of the second waterproof member may be disposed in the "U" shape of the first waterproof member to be covered by the at least one flexible circuit board, and a portion of the fourth waterproof member may be disposed in the "U" shape of the third waterproof member to be covered by the at least one flexible circuit board.

According to an embodiment, the electronic device may further include a first support bracket disposed between the flexible circuit board and a display to support the flexible circuit board while covering the first through-hole, and a second support bracket disposed between the flexible circuit board and the display to support the flexible circuit board while covering the first through-hole, the first waterproof member may be disposed to face a partial area of the first through-hole from the first support bracket, the third waterproof member may be disposed to face a partial area of the second through-hole from the second support bracket, the first waterproof member may be integrally formed with the first support bracket or is assembled in the first support bracket, and the third waterproof member may be integrally formed with the second support bracket or is assembled in the second support bracket.

According to an embodiment, the electronic device may further include a hinge housing disposed between the first housing and the second housing, and at least any one of the first support bracket and the second support bracket may overlap a hinge groove in the hinge housing.

According to an embodiment, the flexible circuit board may include a plurality of flexible films with bonding layers being interposed therebetween, and the bonding layers may be disposed between the first waterproof member and the second waterproof member, and between the third waterproof member and the fourth waterproof member.

The electronic device according to various embodiments may be one of various types of electronic devices. The electronic devices may include, for example, a portable communication device (e.g., a smartphone), a computer device, a portable multimedia device, a portable medical device, a camera, a wearable device, or a home appliance. According to an embodiment of the disclosure, the electronic devices are not limited to those described above.

It should be appreciated that various embodiments of the disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wiredly), wirelessly, or via a third element.

According to various embodiments, each component (e.g., a module or a program) of the above-described components may include a single entity or multiple entities. According to various embodiments, one or more of the above-described components may be omitted, or one or more other components may be added. Alternatively or additionally, a plurality of components (e.g., modules or programs) may be integrated into a single component. In such a case, according to various embodiments, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

While the present disclosure has been shown and described with reference to various embodiments thereof, it will be understood by those skilled in the art that various changes in form and details may be made therein without departing from the present disclosure as defined by the appended claims and their equivalents.

What is claimed is:

1. An electronic device comprising:
   a first housing including a first through-hole;
   a second housing including a second through-hole;
   at least one flexible circuit board passing via the first through-hole and the second through-hole;
   a first support bracket disposed between the at least one flexible circuit board and a display;
   a second support bracket disposed between the at least one flexible circuit board and the display;
   a first waterproof member disposed in a partial area of the first through-hole;
   a second waterproof member disposed in remaining areas of the first through-hole;
   a third waterproof member disposed in a partial area of the second through-hole;
   a fourth waterproof member disposed in remaining areas of the second through-hole;
   a first sealing member disposed on the first waterproof member and the second waterproof member; and
   a second sealing member disposed on the third waterproof member and the fourth waterproof member.

2. The electronic device of claim 1, wherein the first waterproof member is integrally formed with the first support bracket or is assembled in the first support bracket, and
   wherein the third waterproof member is integrally formed with the second support bracket or is assembled in the second support bracket.

3. The electronic device of claim 1, wherein portions of the first waterproof member and the second waterproof member face each other with the at least one flexible circuit board being interposed therebetween;
   wherein remaining portions of the first waterproof member and the second waterproof member face each other while the at least one flexible circuit board is absent in the remaining portions of the first waterproof member and the second waterproof member;
   wherein portions of the third waterproof member and the fourth waterproof member face each other with the at least one flexible circuit board being interposed therebetween; and
   wherein remaining portions of the third waterproof member and the fourth waterproof member face each other while the at least one flexible circuit board is absent in the remaining portions of the third waterproof member and the fourth waterproof member.

4. The electronic device of claim 3, wherein thicknesses of the portions of the first waterproof member and the second waterproof member are larger than thicknesses of the remaining portions of the first waterproof member and the second waterproof member, and
   wherein thicknesses of areas of the portions of the third waterproof member and the fourth waterproof member are larger than thicknesses of the remaining portions of the third waterproof member and the fourth waterproof member.

5. The electronic device of claim 3, wherein the first sealing member is disposed on the remaining portions of the first waterproof member and the second waterproof member, and
   wherein the second sealing member is disposed on the remaining portions of the third waterproof member and the fourth waterproof member.

6. The electronic device of claim 5, wherein the first sealing member is disposed on a first contact point area between an interface of the first waterproof member and the second waterproof member, and a side surface of the at least one flexible circuit board,
   wherein the first sealing member is disposed on a second contact point area between the interface of the first waterproof member and the second waterproof member, and the first housing,
   wherein the second sealing member is disposed on a third contact point area between an interface of the third waterproof member and the fourth waterproof member, and a side surface of the at least one flexible circuit board, and
   wherein the second sealing member is disposed on a fourth contact point area between the interface of the third waterproof member and the fourth waterproof member, and the second housing.

7. The electronic device of claim 1, wherein, in a viewing direction of the display,
   each of the first waterproof member and the third waterproof member has a "U" shape,
   at least a partial area of the second waterproof member is disposed in the "U" shape of the first waterproof member, and
   at least a partial area of the fourth waterproof member is disposed in the "U" shape of the third waterproof member.

8. The electronic device of claim 1, wherein an area of the second waterproof member is smaller than an area of the first waterproof member, and wherein an area of the fourth waterproof member is smaller than an area of the third waterproof member.

9. The electronic device of claim 1, further comprising:
a hinge housing disposed between the first housing and the second housing,
wherein the first support bracket and/or the second support bracket overlaps a hinge groove in the hinge housing.

10. The electronic device of claim 1, wherein the first waterproof member and/or the third waterproof member includes:
a plurality of first bosses; and
first grooves at least one of which is disposed between the plurality of first bosses,
wherein the second waterproof member and/or the fourth waterproof member includes:
a plurality of second bosses facing the first bosses; and
second grooves facing the first grooves and at least one of which is disposed between the second bosses, and
wherein the at least one flexible circuit board is disposed in the first and second grooves.

11. The electronic device of claim 1, wherein the first through-hole includes:
a first opening area, in which the first waterproof member is disposed; and
a second opening area, in which the second waterproof member is disposed,
wherein the second through-hole includes:
a third opening area, in which the third waterproof member is disposed; and
a fourth opening area, in which the fourth waterproof member is disposed,
wherein the first waterproof member is disposed between the first support bracket and the at least one flexible circuit board,
wherein the third waterproof member is disposed between the second support bracket and the at least one flexible circuit board, and
wherein the at least one flexible circuit board is disposed between the second waterproof member and the first support bracket, and between the fourth waterproof member and the second support bracket.

12. The electronic device of claim 11, further comprising:
a recess disposed in the second opening area and/or the fourth opening area and open to the second opening area and/or the fourth opening area,
wherein the second waterproof member and/or the fourth waterproof member is disposed in the recess.

13. The electronic device of claim 1, further comprising:
at least one slot, into which the first sealing member and/or the second sealing member is disposed,
wherein the at least one slot is disposed in the first waterproof member, the second waterproof member, the third waterproof member, the fourth waterproof member, the first housing, and/or the second housing, and is open to the first through-hole and/or the second through-hole.

14. The electronic device of claim 1, wherein the at least one flexible circuit board includes a first flexible area and a second flexible area of different thicknesses, and
wherein a thicker one of the first flexible area and the second flexible area is disposed between the first waterproof member and the second waterproof member, and disposed between the third waterproof member and the fourth waterproof member.

15. The electronic device of claim 1, wherein the first sealing member overlaps the first waterproof member and the second waterproof member in a depth direction of the first through-hole, and the second sealing member overlaps the third waterproof member and the fourth waterproof member in a depth direction of the second through-hole.

16. An electronic device comprising:
a first housing including a first through-hole;
a second housing including a second through-hole;
at least one flexible circuit board passing via the first through-hole and the second through-hole;
a first waterproof member disposed in a partial area of the first through-hole;
a second waterproof member disposed in remaining areas of the first through-hole;
a third waterproof member disposed in a partial area of the second through-hole;
a fourth waterproof member disposed in remaining areas of the second through-hole;
a first sealing member disposed on the first waterproof member and the second waterproof member; and
a second sealing member disposed on the third waterproof member and the fourth waterproof member,
wherein portions of the first waterproof member and the second waterproof member face each other with the at least one flexible circuit board being interposed therebetween;
wherein portions of the third waterproof member and the fourth waterproof member face each other with the at least one flexible circuit board being interposed therebetween;
wherein the first sealing member is disposed on remaining portions of the first waterproof member and the second waterproof member, which face each other while the at least one flexible circuit board is absent in the remaining portions of the first waterproof member and the second waterproof member, and
wherein the second sealing member is disposed on remaining portions of the third waterproof member and the fourth waterproof member, which face each other while the at least one flexible circuit board is absent in the remaining portions of the third waterproof member and the fourth waterproof member.

17. The electronic device of claim 16, wherein, in a viewing direction of front surfaces of the first housing and the second housing,
each of the first waterproof member and the third waterproof member has a "U" shape to cover a partial area of the at least one flexible circuit board,
at least a partial area of the second waterproof member is disposed in the "U" shape of the first waterproof member to be covered by the at least one flexible circuit board, and
at least a partial area of the fourth waterproof member is disposed in the "U" shape of the third waterproof member to be covered by the at least one flexible circuit board.

18. The electronic device of claim 16, further comprising:
a first support bracket disposed between the at least one flexible circuit board and a display; and
a second support bracket disposed between the at least one flexible circuit board and the display,
wherein the first waterproof member is disposed to face a partial area of the first through-hole from the first support bracket,
wherein the third waterproof member is disposed to face a partial area of the second through-hole from the second support bracket, wherein the first waterproof member is integrally formed with the first support bracket or is assembled in the first support bracket, and wherein the third waterproof member is integrally formed with the second support bracket or is assembled in the second support bracket.

19. The electronic device of claim 18, further comprising:
a hinge housing disposed between the first housing and the second housing, wherein the first support bracket and/or the second support bracket overlaps a hinge groove in the hinge housing.

20. The electronic device of claim 16, wherein the at least one flexible circuit board includes a plurality of flexible films disposed with bonding layers being interposed therebetween, and wherein the bonding layers are disposed between the first waterproof member and the second waterproof member, and between the third waterproof member and the fourth waterproof member.

* * * * *